(12) United States Patent
Khoryaev et al.

(10) Patent No.: US 11,558,838 B2
(45) Date of Patent: Jan. 17, 2023

(54) CARRIER AGGREGATION AND HIGH ORDER MODULATION IN VEHICLE-TO-VEHICLE (V2V) SIDELINK COMMUNICATION

(71) Applicant: Apple Inc., Cupertino, CA (US)

(72) Inventors: Alexey Khoryaev, Nizhny Novgorod (RU); Mikhail Shilov, Nizhny Novgorod (RU); Andrey Chervyakov, Nizhny Novgorod (RU); Sergey Panteleev, Nizhny Novgorod (RU); Dmitry Belov, Nizhny Novgorod (RU); Pavel Dyakov, Nizhny Novgorod (RU); Kyeongin Jeong, Youngin-si (KR)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/461,687

(22) Filed: Aug. 30, 2021

(65) Prior Publication Data

US 2022/0022150 A1  Jan. 20, 2022

Related U.S. Application Data

(63) Continuation of application No. 16/496,346, filed as application No. PCT/US2018/023941 on Mar. 23, 2018, now Pat. No. 11,109,334.

(Continued)

(51) Int. Cl.
*H04W 56/00* (2009.01)
*H04B 17/318* (2015.01)
(Continued)

(52) U.S. Cl.
CPC ............ *H04W 56/002* (2013.01); *H03G 3/20* (2013.01); *H04B 17/318* (2015.01);
(Continued)

(58) Field of Classification Search
CPC ... H04W 56/002; H04W 4/46; H04W 72/121; H04W 88/04; H03G 3/20; H04B 17/318;
(Continued)

(56) References Cited

U.S. PATENT DOCUMENTS 11,109,334 B2    8/2021  Khoryaev et al.
2013/0308504 A1* 11/2013 Nimbalker .............. H04L 5/003
                                                    370/329

(Continued)

FOREIGN PATENT DOCUMENTS

DE    112017006734 T5 * 10/2019 ............ H04W 72/02
KR      20140136014 A  *  3/2013
(Continued)

OTHER PUBLICATIONS

Huawei, Hisilicon; "Further discussion on SLSS detection requirements for V2X"; 3GPP TSG-RAN WG4 Meeting #82 R4-1701340; Athens, Greece; Feb. 17, 2017; 2 pages.

(Continued)

*Primary Examiner* — Saad A. Waqas
(74) *Attorney, Agent, or Firm* — Kowert, Hood, Munyon, Rankin & Goetzel, P.C.

(57) ABSTRACT

Embodiments of a User Equipment (UE) and methods for communication are generally described herein. The UE may be configured for carrier aggregation using a primary component carrier (CC) and a secondary CC. The UE may attempt to detect a sidelink synchronization signal (SLSS) from another UE on the primary CC. The UE may, if the SLSS from the other UE is detected: determine, based on the detected SLSS, a common time synchronization for the primary CC and the secondary CC for vehicle-to-vehicle (V2V) sidelink transmissions in accordance with the carrier aggregation. The UE may, if the SLSS from the other UE is not detected: transmit an SLSS to enable determination of (Continued)

the common time synchronization for the primary CC and the secondary CC by the other UE. The SLSS may be transmitted on the primary CC.

20 Claims, 20 Drawing Sheets

Related U.S. Application Data

(60) Provisional application No. 62/476,417, filed on Mar. 24, 2017, provisional application No. 62/476,083, filed on Mar. 24, 2017.

(51) Int. Cl.

| | | |
|---|---|---|
| *H04B 17/382* | (2015.01) | |
| *H04W 4/46* | (2018.01) | |
| *H03G 3/20* | (2006.01) | |
| *H04L 1/00* | (2006.01) | |
| *H04L 5/00* | (2006.01) | |
| *H04L 27/36* | (2006.01) | |
| *H04W 72/12* | (2009.01) | |
| *H04W 88/04* | (2009.01) | |

(52) U.S. Cl.
CPC ......... *H04B 17/382* (2015.01); *H04L 1/0013* (2013.01); *H04L 5/001* (2013.01); *H04L 5/0051* (2013.01); *H04L 27/36* (2013.01); *H04W 4/46* (2018.02); *H04W 72/121* (2013.01); *H04W 88/04* (2013.01)

(58) Field of Classification Search
CPC ..... H04B 17/382; H04L 1/0013; H04L 27/36; H04L 5/001; H04L 5/0051
See application file for complete search history.

(56) References Cited

U.S. PATENT DOCUMENTS

| | | | | |
|---|---|---|---|---|
| 2014/0328329 | A1* | 11/2014 | Novlan | ............. H04W 56/0015 370/336 |
| 2015/0085764 | A1* | 3/2015 | Xiong | ................... H04W 24/10 370/329 |
| 2015/0146647 | A1* | 5/2015 | Chatterjee | ............. H04L 5/1469 370/329 |
| 2016/0330676 | A1 | 11/2016 | Thangarasa | |
| 2016/0337073 | A1* | 11/2016 | Kim | .................. H04W 72/0413 |
| 2017/0273128 | A1 | 9/2017 | Abedini | |
| 2017/0339679 | A1 | 11/2017 | Lee | |
| 2018/0049142 | A1 | 2/2018 | Yang | |
| 2018/0054237 | A1 | 2/2018 | Tseng | |
| 2019/0045345 | A1 | 2/2019 | Lee | |
| 2019/0215817 | A1* | 7/2019 | Chae | ................. H04W 56/0015 |
| 2019/0364492 | A1 | 11/2019 | Azizi | |

FOREIGN PATENT DOCUMENTS

| | | |
|---|---|---|
| WO | 2016148399 A1 | 9/2016 |
| WO | 2016182410 A1 | 11/2016 |
| WO | 2016204590 A1 | 12/2016 |
| WO | 2017007280 A1 | 1/2017 |
| WO | 2017007285 A1 | 1/2017 |
| WO | 2017048099 A1 | 3/2017 |

OTHER PUBLICATIONS

Extended European Search Report for Patent Application No. EP18770752; dated Oct. 12, 2020; 8 Pages.
International Application Serial No. PCT/US2018/023941, International Search Report dated Jul. 24, 2018, 4 pages.
International Application Serial No. PCT/US2018/023941, Written Opinion dated Jul. 24, 2018, 6 pages.
"PSSCH DMRS generation for sidelink V2V communication," Intel Corporation, R1-1611919, 3GPP TSG RAN WG1 Meeting #87, Reno, USA, Nov. 6, 2016, 3 pages.
"Sidelink synchronization enhancement for V2X communications," ITRI, R1-1702389, 3GPP TSG RAN WG1 Meeting #88, Athens, Greece, Feb. 3, 2017, 5 pages.
Intel Corporation, "Discussion on V2V RRM Impacts", 3GPP TSG-RAN WG4, Meeting #80; R4-165024; Aug. 2016; Gothenburg, Sweden; 5 pgs.
Chinese Office Action; Chinese Application No. 201880020676.3; dated Nov. 16, 2021; 10 pgs.

\* cited by examiner

CARRIER AGGREGATION AND HIGH ORDER MODULATION IN VEHICLE-TO-VEHICLE (V2V) SIDELINK COMMUNICATION

PRIORITY CLAIM

This application is a continuation of U.S. application Ser. No. 16/496,346, filed Sep. 20, 2019, which is a U.S. National Stage Filing under 35 U.S.C. 371 from International Application No. PCT/US2018/023941, filed Mar. 23, 2018 and published in English as WO 2018/175842 on Sep. 27, 2018, which claims priority to U.S. Provisional Patent Application Ser. No. 62/476,083, filed Mar. 24, 2017, and to U.S. Provisional Patent Application Ser. No. 62/476,417, filed Mar. 24, 2017, all of which are incorporated herein by reference in their entirety.

The claims in the instant application are different than those of the parent application and/or other related applications. The Applicant therefore rescinds any disclaimer of claim scope made in the parent application and/or any predecessor application in relation to the instant application. Any such previous disclaimer and the cited references that it was made to avoid, may need to be revisited. Further, any disclaimer made in the instant application should not be read into or against the parent application and/or other related applications.

TECHNICAL FIELD

Embodiments pertain to wireless communications. Some embodiments relate to wireless networks including 3GPP (Third Generation Partnership Project) networks, 3GPP LTE (Long Term Evolution) networks, and 3GPP LTE-A (LTE Advanced) networks. Some embodiments relate to Fifth Generation (5G) networks. Some embodiments relate to New Radio (NR) networks. Some embodiments relate to sidelink communication. Some embodiments relate to vehicle-to-vehicle (V2V) communication. Some embodiments relate to transmission of sidelink signals, including V2V sidelink signals. Some embodiments relate to carrier aggregation, including carrier aggregation in accordance with sidelink arrangements.

BACKGROUND

Mobile devices may exchange data in accordance with sidelink communication, which may be challenging. In some cases, such as when mobile devices are out of network coverage, the mobile devices may perform sidelink communication autonomously with limited or no assistance from a base station. In an example scenario, a large number of mobile devices in an area may attempt sidelink communication in resources allocated for this purpose. In another example scenario, one or more mobile devices may attempt to transmit large amounts of data in those resources using sidelink communication. In these scenarios, a capacity may be reached in terms of data rate, number of users or other metric. Accordingly, there is a general need for methods and systems to enable sidelink communication in these and other scenarios.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
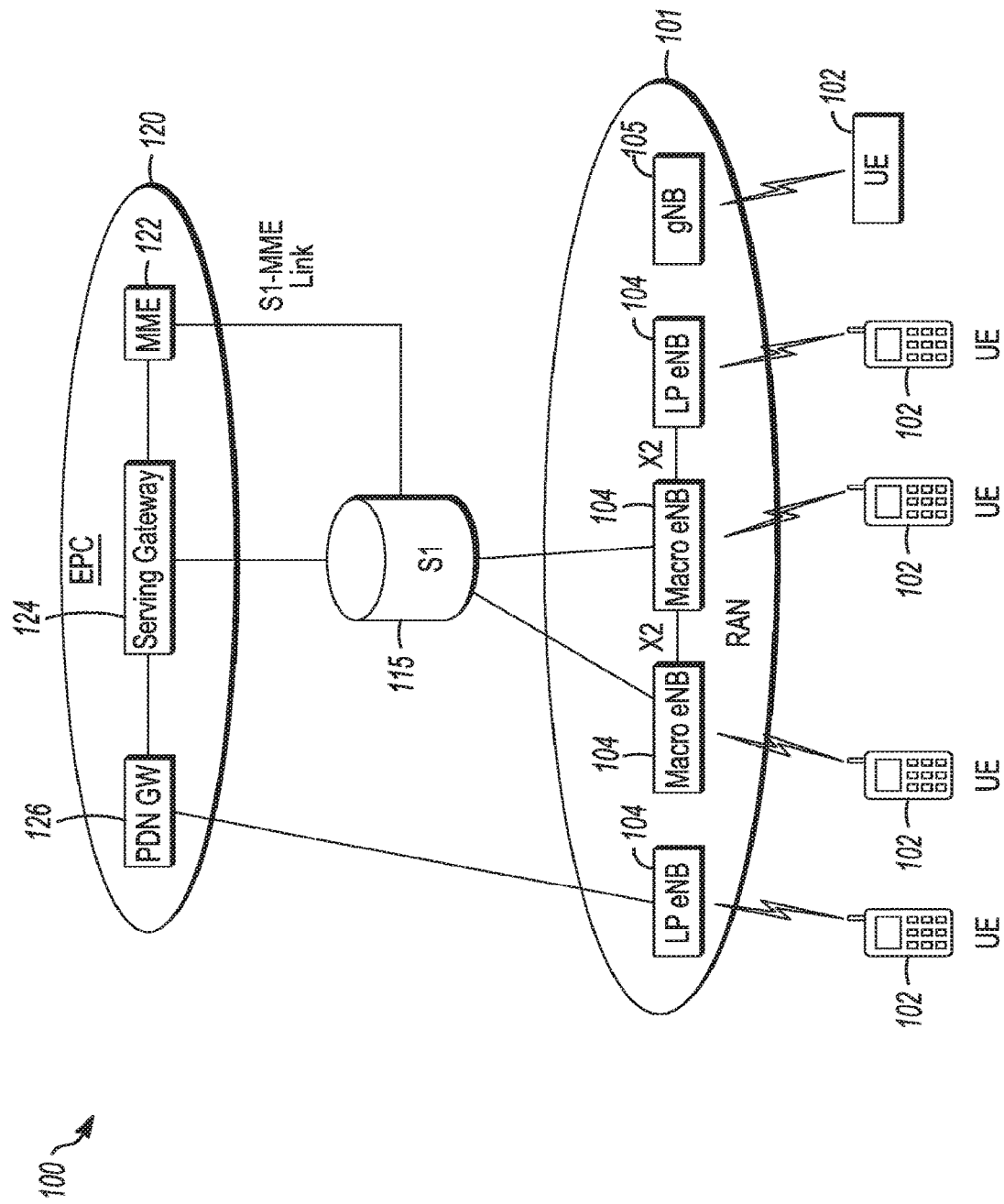
FIG. 1A is a functional diagram of an example network in accordance with some embodiments.
Figure 1B:
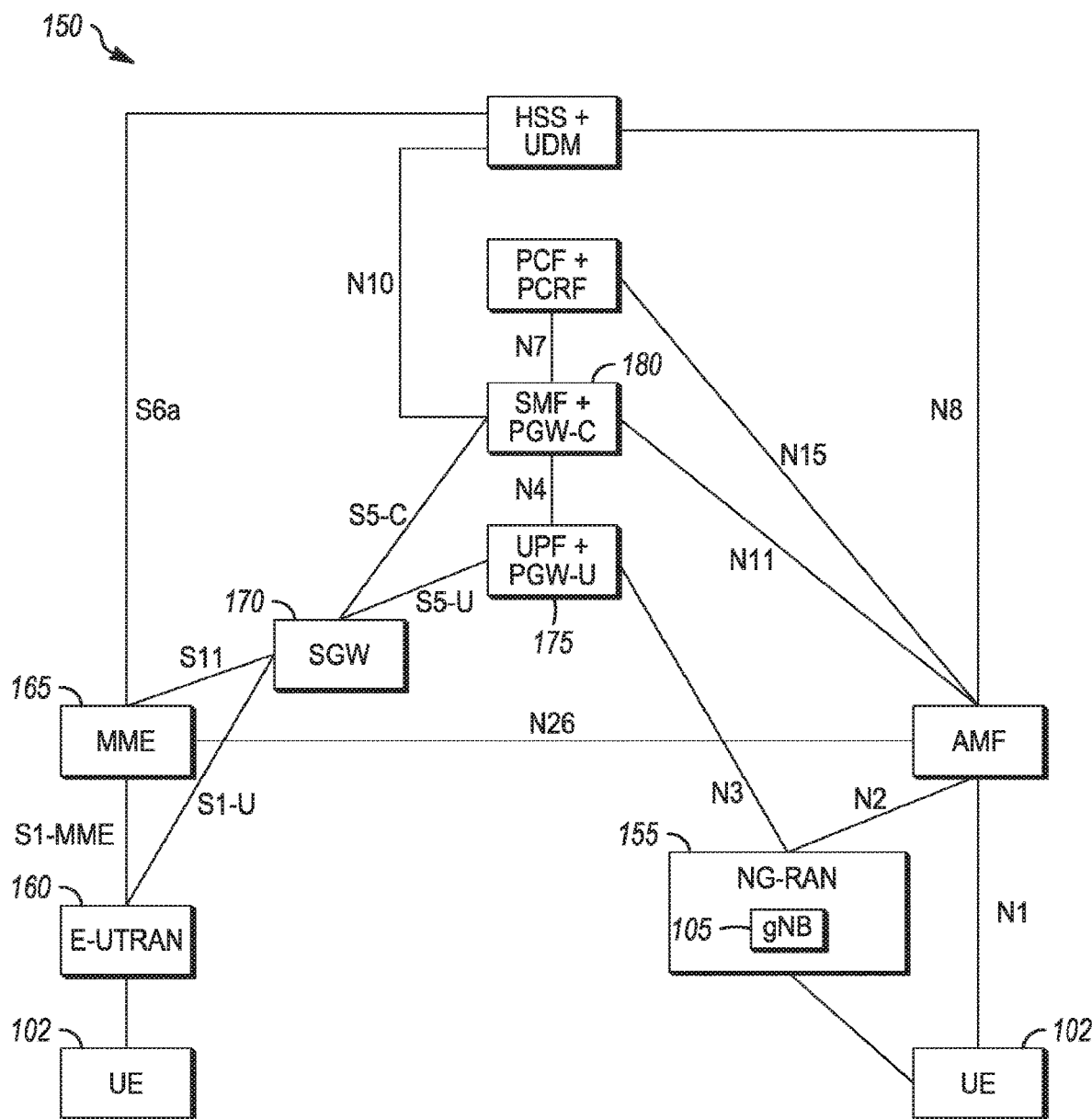
FIG. 1B is a functional diagram of another example network in accordance with some embodiments.

FIG. 1A is a functional diagram of an example network in accordance with some embodiments. FIG. 1B is a functional diagram of another example network in accordance with some embodiments. In references herein, "FIG. 1" may include FIG. 1A and FIG. 1B. In some embodiments, the network 100 may be a Third Generation Partnership Project (3GPP) network. In some embodiments, the network 150 may be a 3GPP network. In a non-limiting example, the network 150 may be a new radio (NR) network. It should be noted that embodiments are not limited to usage of 3GPP networks, however, as other networks may be used in some embodiments. As an example, a Fifth Generation (5G) network may be used in some cases. As another example, a New Radio (NR) network may be used in some cases. As another example, an LTE (E-UTRAN) network may be used in some cases. As another example, a wireless local area network (WLAN) may be used in some cases. Embodiments are not limited to these example networks, however, as other networks may be used in some embodiments. In some embodiments, a network may include one or more components shown in FIG. 1A. Some embodiments may not necessarily include all components shown in FIG. 1A, and some embodiments may include additional components not shown in FIG. 1A. In some embodiments, a network may include one or more components shown in FIG. 1B. Some embodiments may not necessarily include all components shown in FIG. 1B, and some embodiments may include additional components not shown in FIG. 1B. In some embodiments, a network may include one or more components shown in FIG. 1A and one or more components shown in FIG. 1B. In some embodiments, a network may include one or more components shown in FIG. 1A, one or more components shown in FIG. 1B and one or more additional components.

The network 100 may comprise a radio access network (RAN) 101 and the core network 120 (e.g., shown as an evolved packet core (EPC)) coupled together through an S1 interface 115. For convenience and brevity sake, only a portion of the core network 120, as well as the RAN 101, is shown. In a non-limiting example, the RAN 101 may be an evolved universal terrestrial radio access network (E-UTRAN). In another non-limiting example, the RAN 101 may include one or more components of a New Radio (NR) network. In another non-limiting example, the RAN 101 may include one or more components of an E-UTRAN and one or more components of another network (including but not limited to an NR network).

The core network 120 may include a mobility management entity (MME) 122, a serving gateway (serving GW) 124, and packet data network gateway (PDN GW) 126. In some embodiments, the network 100 may include (and/or support) one or more Evolved Node-B's (eNBs) 104 (which may operate as base stations) for communicating with User Equipment (UE) 102. The eNBs 104 may include macro eNBs and low power (LP) eNBs, in some embodiments.

In some embodiments, the network 100 may include (and/or support) one or more Generation Node-B's (gNBs) 105. In some embodiments, one or more eNBs 104 may be configured to operate as gNBs 105. Embodiments are not limited to the number of eNBs 104 shown in FIG. 1A or to the number of gNBs 105 shown in FIG. 1A. In some embodiments, the network 100 may not necessarily include eNBs 104. Embodiments are also not limited to the connectivity of components shown in FIG. 1A.

It should be noted that references herein to an eNB 104 or to a gNB 105 are not limiting. In some embodiments, one or more operations, methods and/or techniques (such as those described herein) may be practiced by a base station component (and/or other component), including but not limited to a gNB 105, an eNB 104, a serving cell, a transmit receive point (TRP) and/or other. In some embodiments, the base station component may be configured to operate in accordance with a New Radio (NR) protocol and/or NR standard, although the scope of embodiments is not limited in this respect. In some embodiments, the base station component may be configured to operate in accordance with a Fifth Generation (5G) protocol and/or 5G standard, although the scope of embodiments is not limited in this respect.

In some embodiments, one or more of the UEs 102 and/or eNBs 104/gNBs 105 may be configured to operate in accordance with an NR protocol and/or NR techniques. References to a UE 102, eNB 104 and/or gNB 105 as part of descriptions herein are not limiting. For instance, descriptions of one or more operations, techniques and/or methods practiced by a gNB 105 are not limiting. In some embodiments, one or more of those operations, techniques and/or methods may be practiced by an eNB 104 and/or other base station component.

In some embodiments, the UE 102 may transmit signals (data, control and/or other) to the gNB 105, and may receive signals (data, control and/or other) from the gNB 105. In some embodiments, the UE 102 may transmit signals (data, control and/or other) to the eNB 104, and may receive signals (data, control and/or other) from the eNB 104. These embodiments will be described in more detail below.

The MME 122 is similar in function to the control plane of legacy Serving GPRS Support Nodes (SGSN). The MME 122 manages mobility aspects in access such as gateway selection and tracking area list management. The serving GW 124 terminates the interface toward the RAN 101, and routes data packets between the RAN 101 and the core network 120. In addition, it may be a local mobility anchor point for inter-eNB handovers and also may provide an anchor for inter-3GPP mobility. Other responsibilities may include lawful intercept, charging, and some policy enforcement. The serving GW 124 and the MME 122 may be implemented in one physical node or separate physical nodes. The PDN GW 126 terminates an SGi interface toward the packet data network (PDN). The PDN GW 126 routes data packets between the EPC 120 and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW 126 and the serving GW 124 may be implemented in one physical node or separated physical nodes.

In some embodiments, the eNBs 104 (macro and micro) terminate the air interface protocol and may be the first point of contact for a UE 102. In some embodiments, an eNB 104 may fulfill various logical functions for the network 100, including but not limited to RNC (radio network controller functions) such as radio bearer management, uplink and downlink dynamic radio resource management and data packet scheduling, and mobility management.

In some embodiments, UEs 102 may be configured to communicate Orthogonal Frequency Division Multiplexing (OFDM) communication signals with an eNB 104 and/or gNB 105 over a multicarrier communication channel in accordance with an Orthogonal Frequency Division Multiple Access (OFDMA) communication technique. In some embodiments, eNBs 104 and/or gNBs 105 may be configured to communicate OFDM communication signals with a UE 102 over a multicarrier communication channel in accordance with an OFDMA communication technique. The OFDM signals may comprise a plurality of orthogonal subcarriers.

The S1 interface 115 is the interface that separates the RAN 101 and the EPC 120. It may be split into two parts: the S1-U, which carries traffic data between the eNBs 104 and the serving GW 124, and the S1-MME, which is a signaling interface between the eNBs 104 and the MME 122. The X2 interface is the interface between eNBs 104. The X2 interface comprises two parts, the X2-C and X2-U. The X2-C is the control plane interface between the eNBs 104, while the X2-U is the user plane interface between the eNBs 104.

In some embodiments, similar functionality and/or connectivity described for the eNB 104 may be used for the gNB 105, although the scope of embodiments is not limited in this respect. In a non-limiting example, the S1 interface 115 (and/or similar interface) may be split into two parts: the S1-U, which carries traffic data between the gNBs 105 and the serving GW 124, and the S1-MME, which is a signaling interface between the gNBs 105 and the MME 122. The X2 interface (and/or similar interface) may enable communication between eNBs 104, communication between gNBs 105 and/or communication between an eNB 104 and a gNB 105.

With cellular networks, LP cells are typically used to extend coverage to indoor areas where outdoor signals do not reach well, or to add network capacity in areas with very dense phone usage, such as train stations. As used herein, the term low power (LP) eNB refers to any suitable relatively low power eNB for implementing a narrower cell (narrower than a macro cell) such as a femtocell, a picocell, or a micro cell. Femtocell eNBs are typically provided by a mobile network operator to its residential or enterprise customers. A femtocell is typically the size of a residential gateway or smaller and generally connects to the user's broadband line. Once plugged in, the femtocell connects to the mobile operator's mobile network and provides extra coverage in a range of typically 30 to 50 meters for residential femtocells. Thus, a LP eNB might be a femtocell eNB since it is coupled through the PDN GW 126. Similarly, a picocell is a wireless communication system typically covering a small area, such as in-building (offices, shopping malls, train stations, etc.), or more recently in-aircraft. A picocell eNB can generally connect through the X2 link to another eNB such as a macro eNB through its base station controller (BSC) functionality. Thus, LP eNB may be implemented with a picocell eNB since it is coupled to a macro eNB via an X2 interface. Picocell eNBs or other LP eNBs may incorporate some or all functionality of a macro eNB. In some cases, this may be referred to as an access point base station or enterprise femtocell. In some embodiments, various types of gNBs 105 may be used, including but not limited to one or more of the eNB types described above.

In some embodiments, the network 150 may include one or more components configured to operate in accordance with one or more 3GPP standards, including but not limited to an NR standard. The network 150 shown in FIG. 1B may include a next generation RAN (NG-RAN) 155, which may include one or more gNBs 105. In some embodiments, the network 150 may include the E-UTRAN 160, which may include one or more eNBs. The E-UTRAN 160 may be similar to the RAN 101 described herein, although the scope of embodiments is not limited in this respect.

In some embodiments, the network 150 may include the MME 165. The MME 165 may be similar to the MME 122 described herein, although the scope of embodiments is not limited in this respect. The MME 165 may perform one or more operations or functionality similar to those described herein regarding the MME 122, although the scope of embodiments is not limited in this respect.

In some embodiments, the network 150 may include the SGW 170. The SGW 170 may be similar to the SGW 124 described herein, although the scope of embodiments is not limited in this respect. The SGW 170 may perform one or more operations or functionality similar to those described herein regarding the SGW 124, although the scope of embodiments is not limited in this respect.

In some embodiments, the network 150 may include component(s) and/or module(s) for functionality for a user plane function (UPF) and user plane functionality for PGW (PGW-U), as indicated by 175. In some embodiments, the network 150 may include component(s) and/or module(s) for functionality for a session management function (SMF) and control plane functionality for PGW (PGW-C), as indicated by 180. In some embodiments, the component(s) and/or module(s) indicated by 175 and/or 180 may be similar to the PGW 126 described herein, although the scope of embodiments is not limited in this respect. The component(s) and/or module(s) indicated by 175 and/or 180 may perform one or more operations or functionality similar to those described herein regarding the PGW 126, although the scope of embodiments is not limited in this respect. One or both of the components 170, 172 may perform at least a portion of the functionality described herein for the PGW 126, although the scope of embodiments is not limited in this respect.

Embodiments are not limited to the number or type of components shown in FIG. 1B. Embodiments are also not limited to the connectivity of components shown in FIG. 1B.

In some embodiments, a downlink resource grid may be used for downlink transmissions from an eNB 104 to a UE 102, while uplink transmission from the UE 102 to the eNB 104 may utilize similar techniques. In some embodiments, a downlink resource grid may be used for downlink transmissions from a gNB 105 to a UE 102, while uplink transmission from the UE 102 to the gNB 105 may utilize similar techniques. The grid may be a time-frequency grid, called a resource grid or time-frequency resource grid, which is the physical resource in the downlink in each slot. Such a time-frequency plane representation is a common practice for OFDM systems, which makes it intuitive for radio resource allocation. Each column and each row of the resource grid correspond to one OFDM symbol and one OFDM subcarrier, respectively. The duration of the resource grid in the time domain corresponds to one slot in a radio frame. The smallest time-frequency unit in a resource grid is denoted as a resource element (RE). There are several different physical downlink channels that are conveyed using such resource blocks. With particular relevance to this disclosure, two of these physical downlink channels are the physical downlink shared channel and the physical down link control channel.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Figure 2:
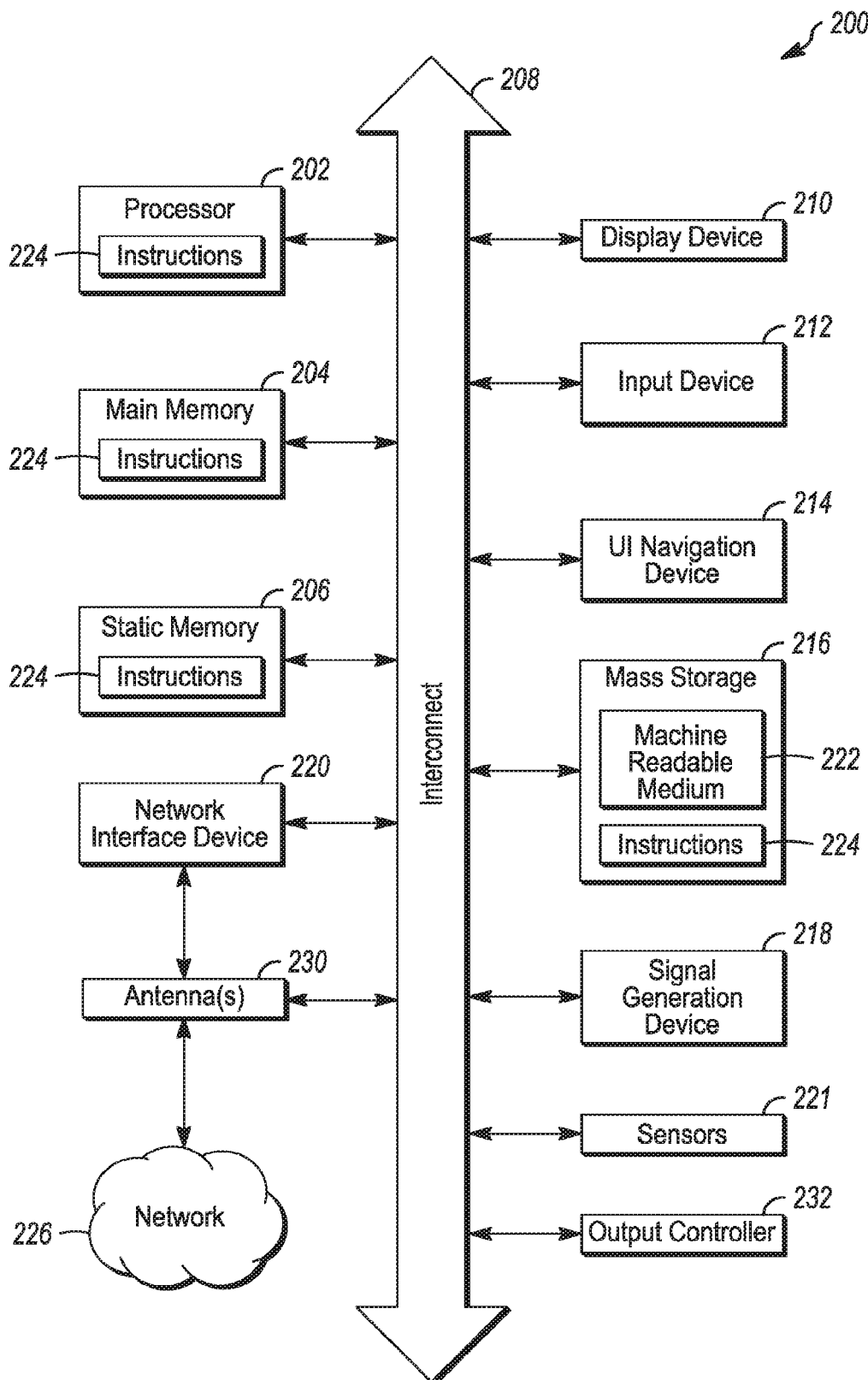
FIG. 2 illustrates a block diagram of an example machine in accordance with some embodiments.

FIG. 2 illustrates a block diagram of an example machine in accordance with some embodiments. The machine 200 is an example machine upon which any one or more of the techniques and/or methodologies discussed herein may be performed. In alternative embodiments, the machine 200 may operate as a standalone device or may be connected (e.g., networked) to other machines. In a networked deployment, the machine 200 may operate in the capacity of a server machine, a client machine, or both in server-client network environments. In an example, the machine 200 may act as a peer machine in peer-to-peer (P2P) (or other distributed) network environment. The machine 200 may be a UE 102, eNB 104, gNB 105, access point (AP), station (STA), user, device, mobile device, base station, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer system) 200 may include a hardware processor 202 (e.g., a central processing unit (CPU), a graphics processing unit (GPU), a hardware processor core, or any combination thereof), a main memory 204 and a static memory 206, some or all of which may communicate with each other via an interlink (e.g, bus) 208. The machine 200 may further include a display unit 210, an alphanumeric input device 212 (e.g., a keyboard), and a user interface (UI) navigation device 214 (e.g., a mouse). In an example, the display unit 210, input device 212 and UI navigation device 214 may be a touch screen display. The machine 200 may additionally include a storage device (e.g., drive unit) 216, a signal generation device 218 (e.g., a speaker), a network interface device 220, and one or more sensors 221, such as a global positioning system (GPS) sensor, compass, accelerometer, or other sensor. The machine 200 may include an output controller 228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a machine readable medium 222 on which is stored one or more sets of data structures or instructions 224 (e.g., software) embodying or utilized by any one or more of the techniques or functions described herein. The instructions 224 may also reside, completely or at least partially, within the main memory 204, within static memory 206, or within the hardware processor 202 during execution thereof by the machine 200. In an example, one or any combination of the hardware processor 202, the main memory 204, the static memory 206, or the storage device 216 may constitute machine readable media. In some embodiments, the machine readable medium may be or may include a non-transitory computer-readable storage medium. In some embodiments, the machine readable medium may be or may include a computer-readable storage medium.

While the machine readable medium 222 is illustrated as a single medium, the term "machine readable medium" may include a single medium or multiple media (e.g., a centralized or distributed database, and/or associated caches and servers) configured to store the one or more instructions 224. The term "machine readable medium" may include any medium that is capable of storing, encoding, or carrying instructions for execution by the machine 200 and that cause the machine 200 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices: magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 224 may further be transmitted or received over a communications network 226 using a transmission medium via the network interface device 220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks). Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 220 may include one or more physical jacks (e.g., Ethernet, coaxial, or phone jacks) or one or more antennas to connect to the communications network 226. In an example, the network interface device 220 may include a plurality of antennas to wirelessly communicate using at least one of single-input multiple-output (SIMO), multiple-input multiple-output (MIMO), or multiple-input single-output (MISO) techniques. In some examples, the network interface device 220 may wirelessly communicate using Multiple User MIMO techniques. The term "transmission medium" shall be taken to include any intangible medium that is capable of storing, encoding or carrying instructions for execution by the machine 200, and includes digital or analog communications signals or other intangible medium to facilitate communication of such software.

Figure 3:
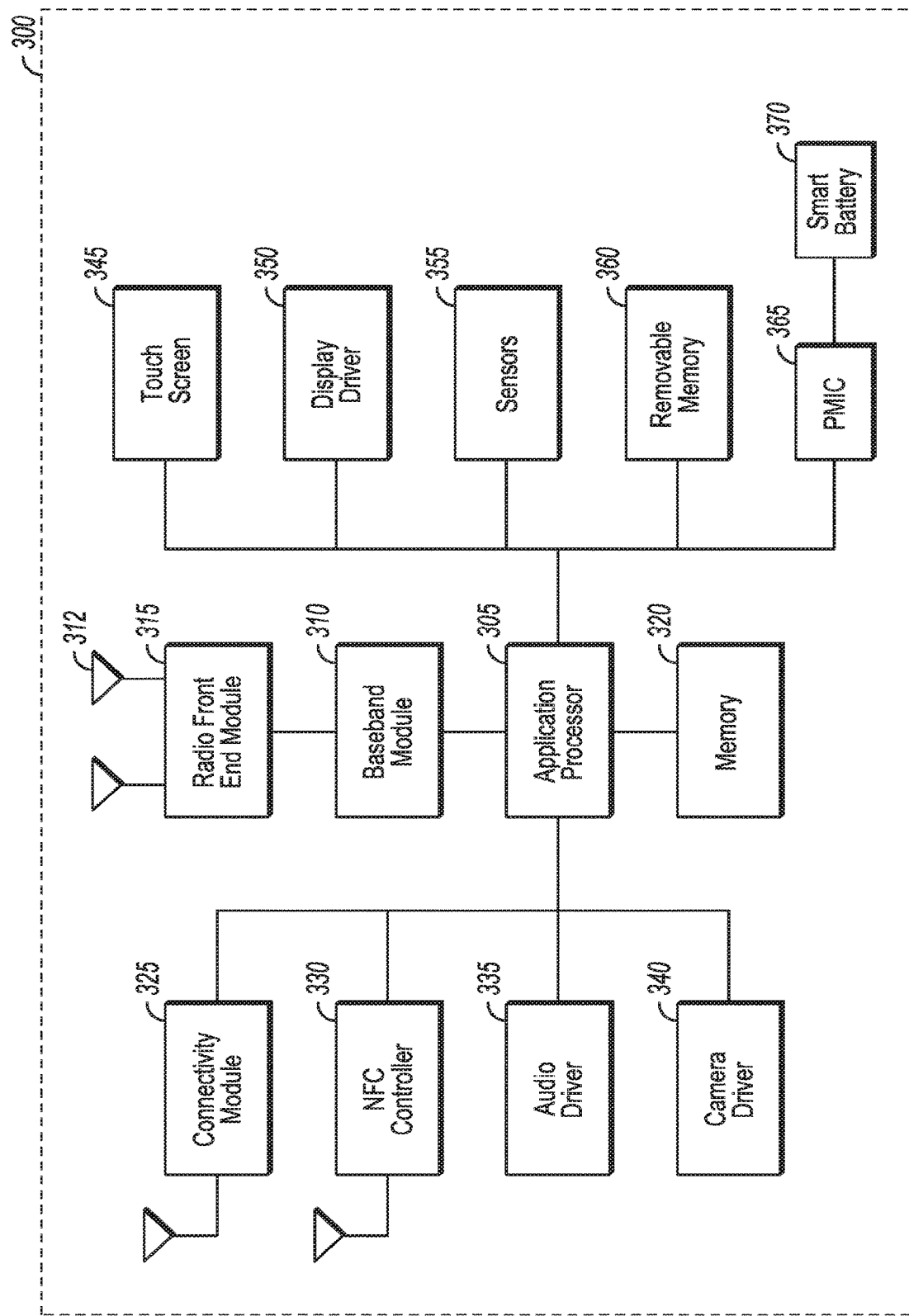
FIG. 3 illustrates a user device in accordance with some aspects.

FIG. 3 illustrates a user device in accordance with some aspects. In some embodiments, the user device 300 may be a mobile device. In some embodiments, the user device 300 may be or may be configured to operate as a User Equipment (UE). In some embodiments, the user device 300 may be arranged to operate in accordance with a new radio (NR) protocol. In some embodiments, the user device 300 may be arranged to operate in accordance with a Third Generation Partnership Protocol (3GPP) protocol. The user device 300 may be suitable for use as a UE 102 as depicted in FIG. 1, in some embodiments. It should be noted that in some embodiments, a UE, an apparatus of a UE, a user device or an apparatus of a user device may include one or more of the components shown in one or more of FIGS. 2, 3, and 5. In some embodiments, such a UE, user device and/or apparatus may include one or more additional components.

In some aspects, the user device 300 may include an application processor 305, baseband processor 310 (also referred to as a baseband module), radio front end module (RFEM) 315, memory 320, connectivity module 325, near field communication (NFC) controller 330, audio driver 335, camera driver 340, touch screen 345, display driver 350, sensors 355, removable memory 360, power management integrated circuit (PMIC) 365 and smart battery 370. In some aspects, the user device 300 may be a User Equipment (UE).

In some aspects, application processor 305 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (10), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 310 may be implemented, for example, as a solder-down substrate including one or more integrated circuits, a single packaged integrated circuit soldered to a main circuit board, and/or a multi-chip module containing two or more integrated circuits.

Figure 4:
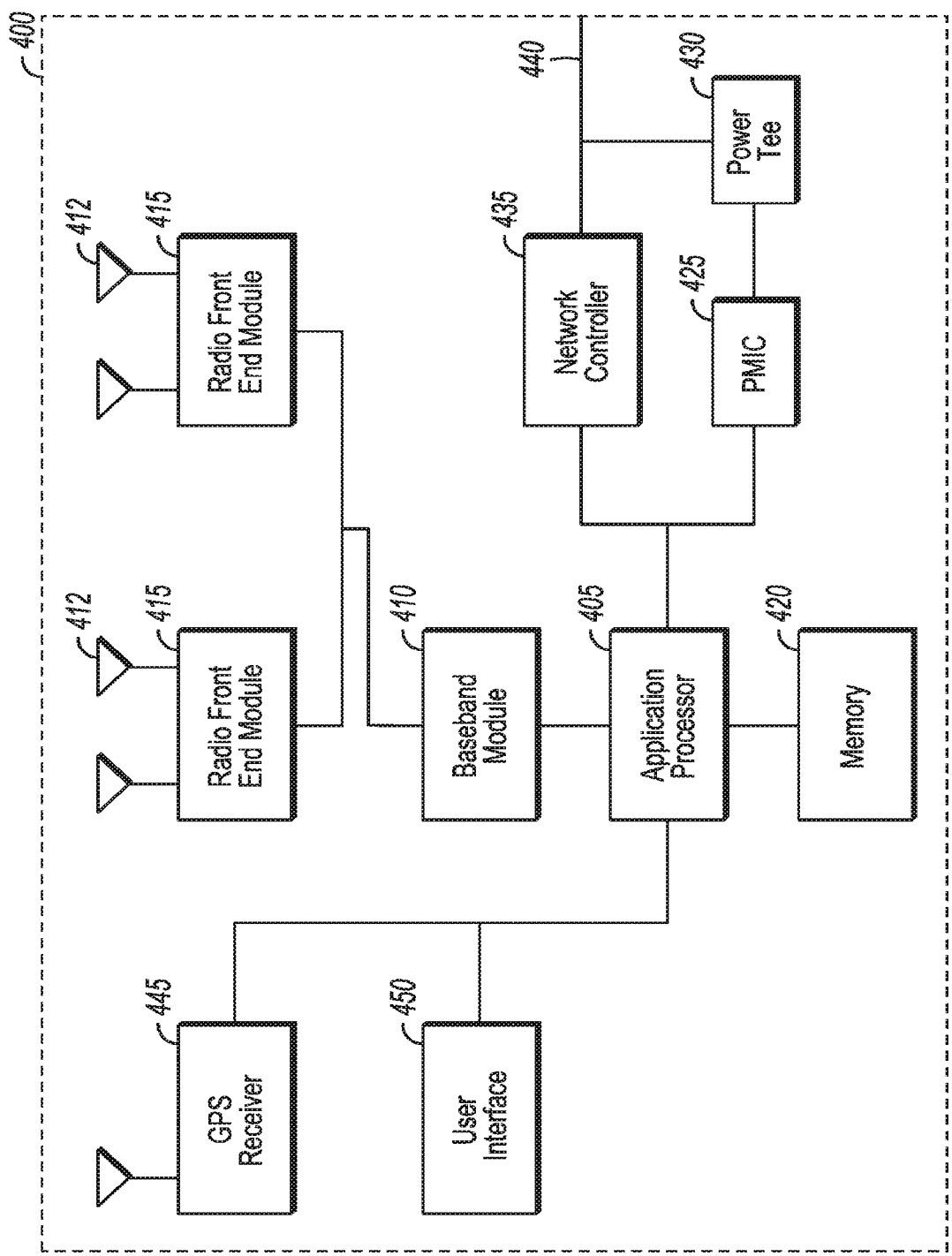
FIG. 4 illustrates a base station in accordance with some aspects.

FIG. 4 illustrates a base station in accordance with some aspects. In some embodiments, the base station 400 may be or may be configured to operate as an Evolved Node-B (eNB). In some embodiments, the base station 400 may be or may be configured to operate as a Generation Node-B (gNB). In some embodiments, the base station 400 may be arranged to operate in accordance with a new radio (NR) protocol. In some embodiments, the base station 400 may be arranged to operate in accordance with a Third Generation Partnership Protocol (3GPP) protocol. It should be noted that in some embodiments, the base station 400 may be a stationary non-mobile device. The base station 400 may be suitable for use as an eNB 104 as depicted in FIG. 1, in some embodiments. The base station 400 may be suitable for use as a gNB 105 as depicted in FIG. 1, in some embodiments. It should be noted that in some embodiments, an eNB, an apparatus of an eNB, a gNB, an apparatus of a gNB, a base station and/or an apparatus of a base station may include one or more of the components shown in one or more of FIGS. 2, 4, and 5. In some embodiments, such an eNB, gNB, base station and/or apparatus may include one or more additional components.

FIG. 4 illustrates a base station or infrastructure equipment radio head 400 in accordance with an aspect. The base station 400 may include one or more of application processor 405, baseband modules 410, one or more radio front end modules 415, memory 420, power management circuitry 425, power tee circuitry 430, network controller 435, network interface connector 440, satellite navigation receiver module 445, and user interface 450. In some aspects, the base station 400 may be an Evolved Node-B (eNB), which may be arranged to operate in accordance with a 3GPP protocol, new radio (NR) protocol and/or Fifth Generation (5G) protocol. In some aspects, the base station 400 may be a generation Node-B (gNB), which may be arranged to operate in accordance with a 3GPP protocol, new radio (NR) protocol and/or Fifth Generation (5G) protocol.

In some aspects, application processor 405 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose 10, memory card controllers such as SD/MMC or similar, USB interfaces, MIPI interfaces and Joint Test Access Group (JTAG) test access ports.

In some aspects, baseband processor 410 may be implemented, for example, as a solder-down substrate including one or more integrated circuits, a single packaged integrated circuit soldered to a main circuit board or a multi-chip module containing two or more integrated circuits.

In some aspects, memory 420 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto-resistive random access memory (MRAM) and/or a three-dimensional cross-point memory. Memory 420 may be implemented as one or more of solder down packaged integrated circuits, socketed memory modules and plug-in memory cards.

In some aspects, power management integrated circuitry 425 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 430 may provide for electrical power drawn from a network cable to provide both power supply and data connectivity to the base station 400 using a single cable. In some aspects, network controller 435 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 445 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 445 may provide data to application processor 405 which may include one or more of position data or time data. Application processor 405 may use time data to synchronize operations with other radio base stations. In some aspects, user interface 450 may include one or more of physical or virtual buttons, such as a reset button, one or more indicators such as light emitting diodes (LEDs) and a display screen.

Figure 5:
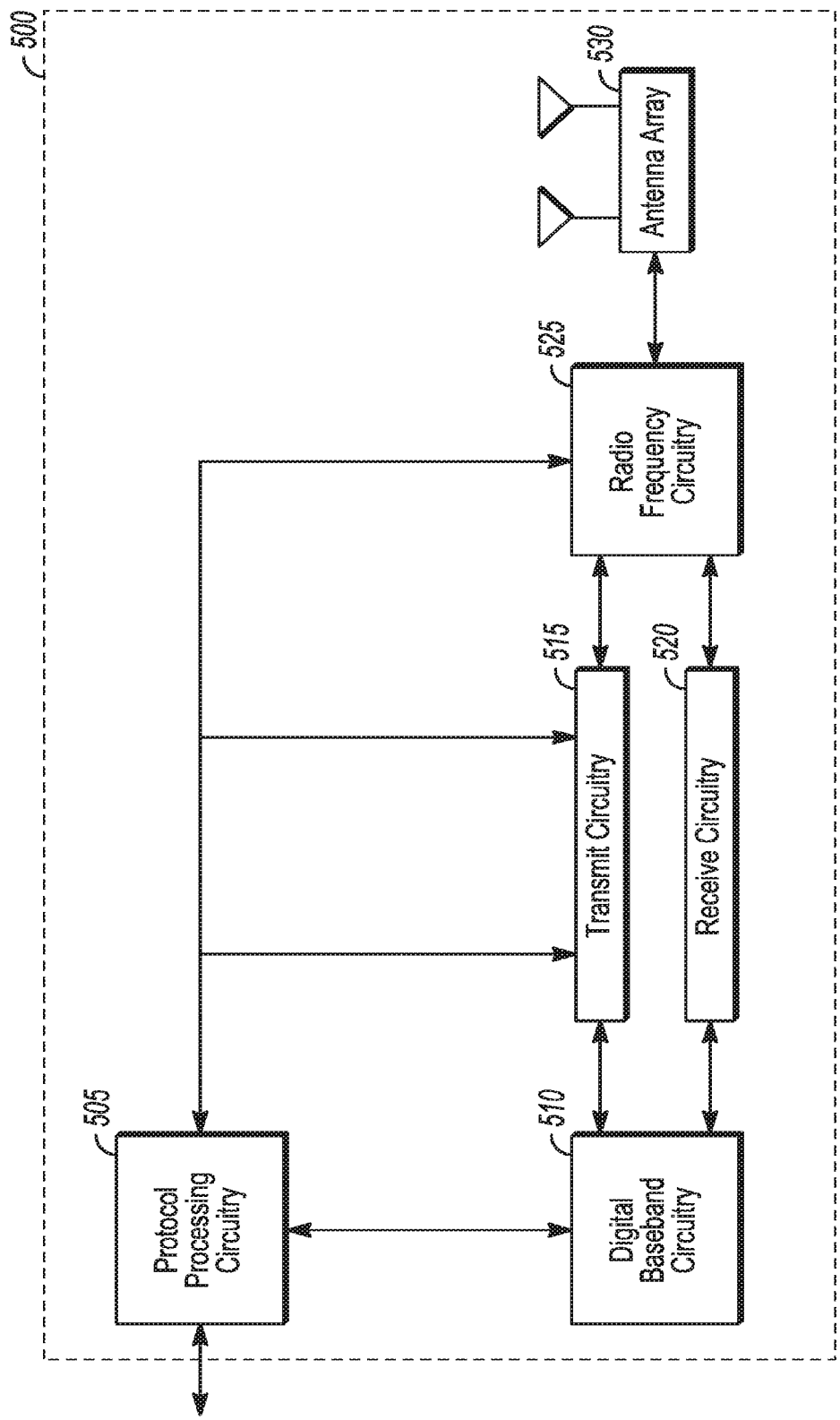
FIG. 5 illustrates an exemplary communication circuitry according to some aspects.

FIG. 5 illustrates an exemplary communication circuitry according to some aspects. Circuitry 500 is alternatively grouped according to functions. Components as shown in Circuitry 500 are shown here for illustrative purposes and may include other components not shown here in FIG. 5. In some aspects, the communication circuitry 500 may be used for millimeter wave communication, although aspects are not limited to millimeter wave communication. Communication at any suitable frequency may be performed by the communication circuitry 500 in some aspects.

It should be noted that a device, such as a UE 102, eNB 104, gNB 105, the user device 300, the base station 400, the machine 200 and/or other device may include one or more components of the communication circuitry 500, in some aspects.

The communication circuitry 500 may include protocol processing circuitry 505, which may implement one or more of medium access control (MAC), radio link control (RLC), packet data convergence protocol (PDCP), radio resource control (RRC) and non-access stratum (NAS) functions. Protocol processing circuitry 505 may include one or more processing cores (not shown) to execute instructions and one or more memory structures (not shown) to store program and data information.

The communication circuitry 500 may further include digital baseband circuitry 510, which may implement physical layer (PIY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

The communication circuitry 500 may further include transmit circuitry 515, receive circuitry 520 and/or antenna array circuitry 530. The communication circuitry 500 may further include radio frequency (RF) circuitry 525. In an aspect of the disclosure, RF circuitry 525 may include multiple parallel RF chains for one or more of transmit or receive functions, each connected to one or more antennas of the antenna array 530.

In an aspect of the disclosure, protocol processing circuitry 505 may include one or more instances of control circuitry (not shown) to provide control functions for one or more of digital baseband circuitry 510, transmit circuitry 515, receive circuitry 520, and/or radio frequency circuitry 525

In some embodiments, processing circuitry may perform one or more operations described herein and/or other operation(s). In a non-limiting example, the processing circuitry may include one or more components such as the processor 202, application processor 305, baseband module 310, application processor 405, baseband module 410, protocol processing circuitry 505, digital baseband circuitry 510, similar component(s) and/or other component(s).

In some embodiments, a transceiver may transmit one or more elements (including but not limited to those described herein) and/or receive one or more elements (including but not limited to those described herein). In a non-limiting example, the transceiver may include one or more components such as the radio front end module 315, radio front end module 415, transmit circuitry 515, receive circuitry 520, radio frequency circuitry 525, similar component(s) and/or other component(s).

One or more antennas (such as 230, 312, 412, 530 and/or others) may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, one or more of the antennas (such as 230, 312, 412, 530 and/or others) may be effectively separated to take advantage of spatial diversity and the different channel characteristics that may result.

In some embodiments, the UE 102, eNB 104, gNB 105, user device 300, base station 400, machine 200 and/or other device described herein may be a mobile device and/or portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a wearable device such as a medical device (e.g., a heart rate monitor, a blood pressure monitor, etc.), or other device that may receive and/or transmit information wirelessly. In some embodiments, the UE 102, eNB 104, gNB 105, user device 300, base station 400, machine 200 and/or other device described herein may be configured to operate in accordance with 3GPP standards, although the scope of the embodiments is not limited in this respect. In some embodiments, the UE 102, eNB 104, gNB 105, user device 300, base station 400, machine 200 and/or other device described herein may be configured to operate in accordance with new radio (NR) standards, although the scope of the embodiments is not limited in this respect. In some embodiments, the UE 102, eNB 104, gNB 105, user device 300, base station 400, machine 200 and/or other device described herein may be configured to operate according to other protocols or standards, including IEEE 802.11 or other IEEE standards. In some embodiments, the UE 102, eNB 104, gNB 105, user device 300, base station 400, machine 200 and/or other device described herein may include one or more of a keyboard, a display, a non-volatile memory port, multiple antennas, a graphics processor, an application processor, speakers, and other mobile device elements. The display may be an LCD screen including a touch screen.

Although the UE 102, eNB 104, gNB 105, user device 300, base station 400, machine 200 and/or other device described herein may each be illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

It should be noted that in some embodiments, an apparatus used by the UE 102, eNB 104, gNB 105, machine 200, user device 300 and/or base station 400 may include various components shown in FIGS. 2-5. Accordingly, techniques and operations described herein that refer to the UE 102 may be applicable to an apparatus of a UE. In addition, techniques and operations described herein that refer to the eNB 104 may be applicable to an apparatus of an eNB. In addition, techniques and operations described herein that refer to the gNB 105 may be applicable to an apparatus of a gNB.

Figure 6:
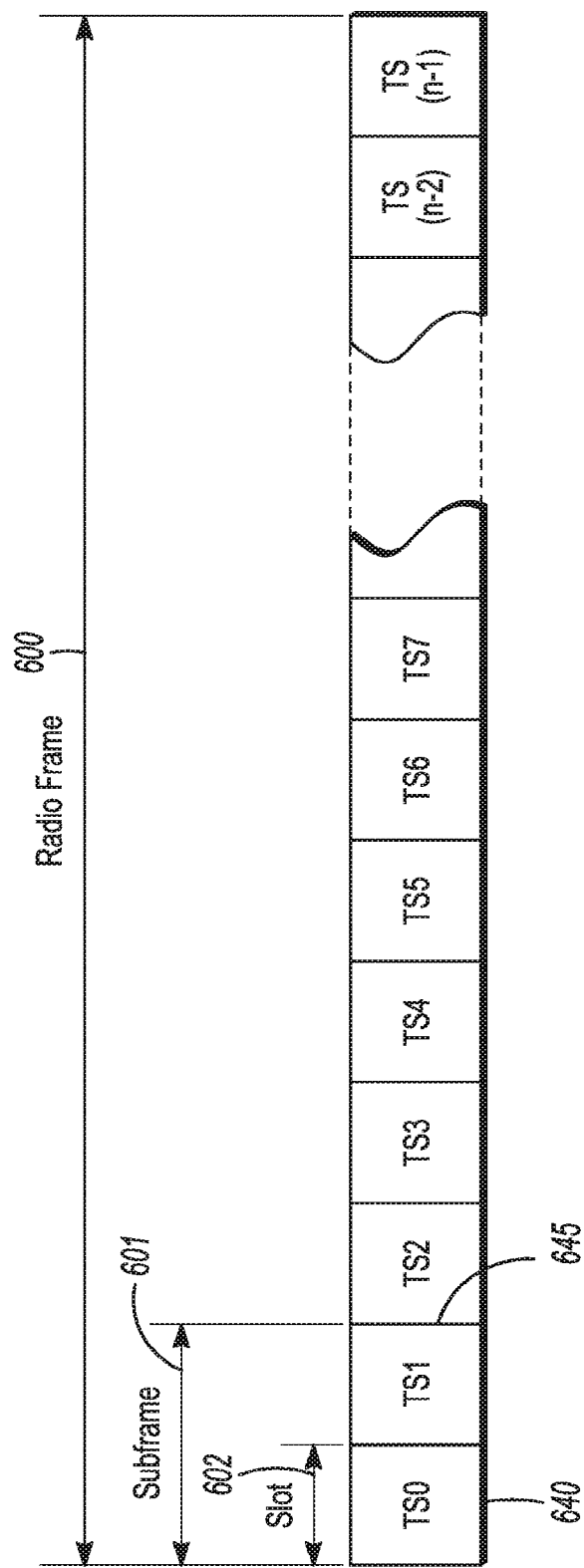
FIG. 6 illustrates an example of a radio frame structure in accordance with some embodiments.
Figures 7A, 7B:
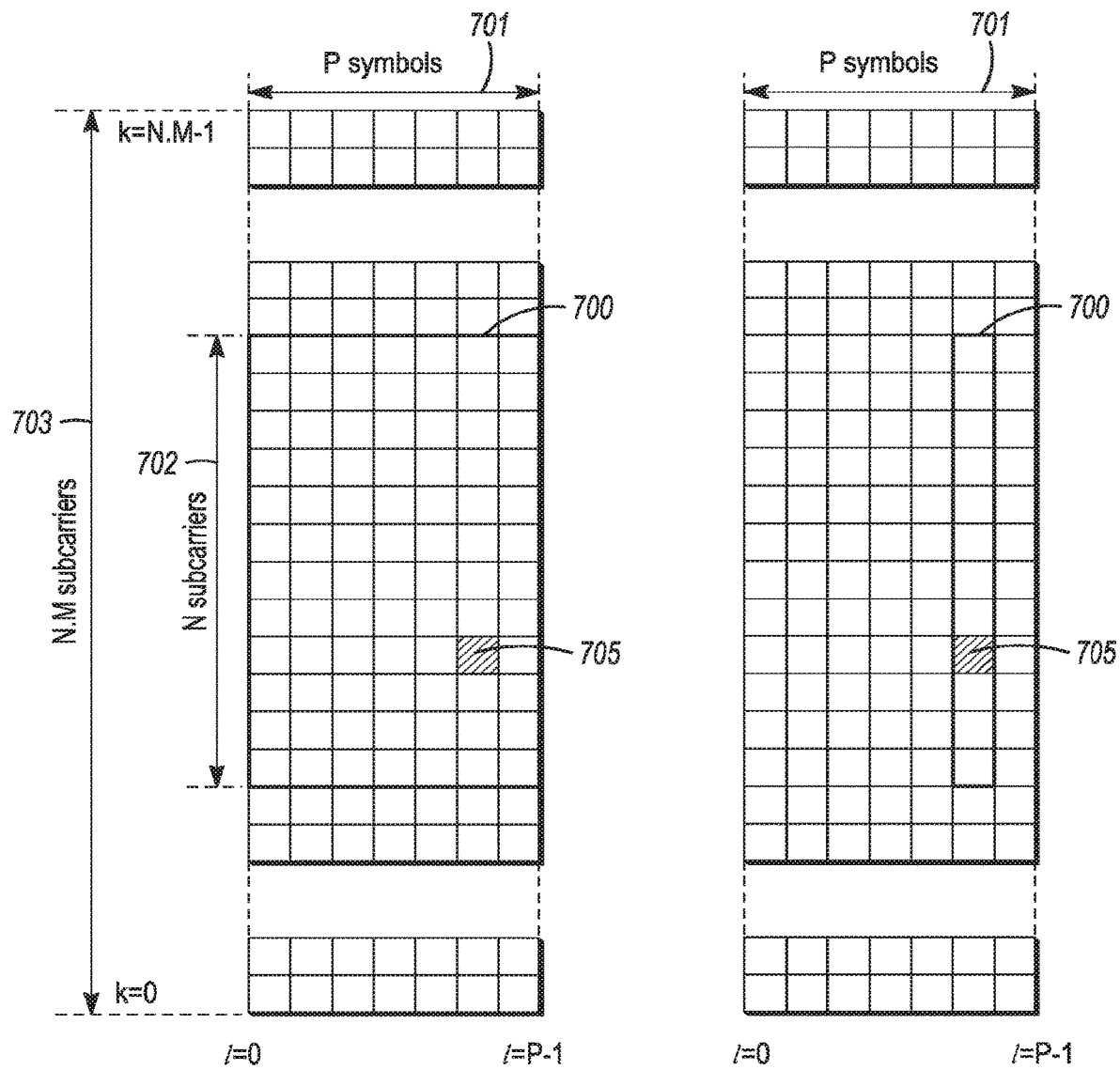
FIG. 7A and FIG. 7B illustrate example frequency resources in accordance with some embodiments.
Figure 8A:
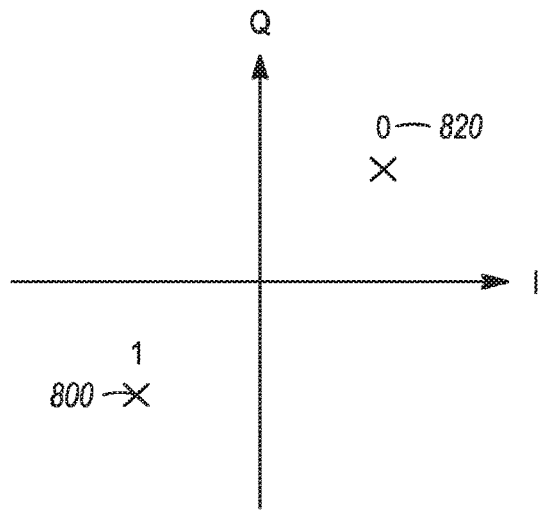
FIG. 8A, FIG. 8B and FIG. 8C illustrate examples of constellations that may be transmitted or received in accordance with some embodiments.
Figure 8B:
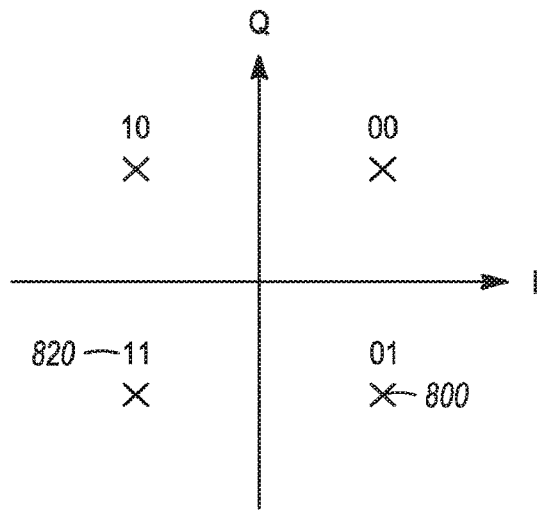
Figure 8C:
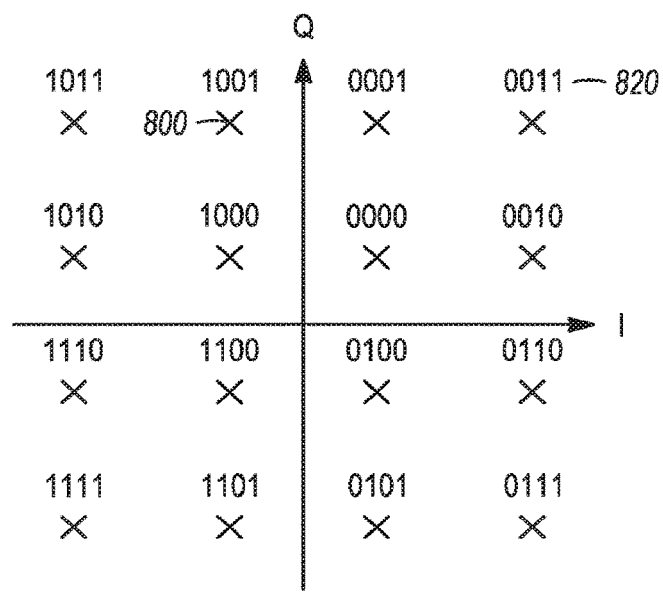

FIG. 6 illustrates an example of a radio frame structure in accordance with some embodiments. FIGS. 7A and 7B illustrate example frequency resources in accordance with some embodiments. In references herein, "FIG. 7" may include FIG. 7A and FIG. 7B. FIG. 8A, FIG. 8B and FIG. 8C illustrate examples of constellations that may be transmitted or received in accordance with some embodiments. In references herein, "FIG. 8" may include FIG. 8A, FIB. 8B and FIG. 8C. It should be noted that the examples shown in FIGS. 6-8 may illustrate some or all of the concepts and techniques described herein in some cases, but embodiments are not limited by the examples. For instance, embodiments are not limited by the name, number, type, size, ordering, arrangement and/or other aspects of the time resources, symbol periods, frequency resources, PRBs, constellation points, modulation formats and other elements as shown in FIGS. 6-8. Although some of the elements shown in the examples of FIGS. 6-8 may be included in a 3GPP LTE standard, 5G standard, NR standard and/or other standard, embodiments are not limited to usage of such elements that are included in standards.

An example of a radio frame structure that may be used in some aspects is shown in FIG. 6. In this example, radio frame 600 has a duration of 10 ms. Radio frame 600 is divided into slots 602 each of duration 0.5 ms, and numbered from 0 to 19. Additionally, each pair of adjacent slots 602 numbered 2i and 2i+1, where i is an integer, is referred to as a subframe 601.

In some aspects using the radio frame format of FIG. 6, each subframe 601 may include a combination of one or more of downlink control information, downlink data information, uplink control information and uplink data information, sidelink control and data information. The combination of information types and direction may be selected independently for each subframe 601.

Referring to FIGS. 7A and 7B, in some aspects, a sub-component of a transmitted signal consisting of one subcarrier in the frequency domain and one symbol interval in the time domain may be termed a resource element. Resource elements may be depicted in a grid form as shown in FIG. 7A and FIG. 7B.

In some aspects, illustrated in FIG. 7A, resource elements may be grouped into rectangular resource blocks 700 consisting of 12 subcarriers in the frequency domain and the P symbols in the time domain, where P may correspond to the number of symbols contained in one slot, and may be 6, 7, or any other suitable number of symbols.

In some alternative aspects, illustrated in FIG. 7B, resource elements may be grouped into resource blocks 700 consisting of 12 subcarriers (as indicated by 702) in the frequency domain and one symbol in the time domain. In the depictions of FIG. 7A and FIG. 7B, each resource element 705 may be indexed as (k, l) where k is the index number of subcarrier, in the range 0 to N·M−1 (as indicated by 703), where N is the number of subcarriers in a resource block, and M is the number of resource blocks spanning a component carrier in the frequency domain.

FIGS. 8A, 8B and 8C illustrate examples of constellations that may be transmitted or received in accordance with some embodiments. Constellation points are shown on orthogonal in-phase and quadrature axes, representing, respectively, amplitudes of sinusoids at the carrier frequency and separated in phase from one another by 90 degrees.

FIG. 8A represents a constellation containing 2 points 800, known as binary phase shift keying (BPSK). FIG. 8B represents a constellation containing 4 points 800, known as quadrature phase shift keying (QPSK). FIG. 8C represents a constellation containing 16 points 800, known as quadrature amplitude modulation (QAM) with 16 points (16QAM or QAM16). Higher order modulation constellations, containing for example 64, 256 or 1024 points may be similarly constructed.

In the constellations depicted in FIGS. 8A, 8B and 8C, binary codes 820 are assigned to the points 800 of the constellation using a scheme such that nearest-neighbor points 800, that is, pairs of points 800 separated from each other by the minimum Euclidian distance, have an assigned binary code 820 differing by one binary digit. For example, in FIG. 8C the point assigned code 1000 has nearest neighbor points assigned codes 1001, 0000, 1100 and 1010, each of which differs from 1000 by one bit.

In accordance with some embodiments, the UE 102 may be configured for carrier aggregation using a primary component carrier (CC) and a secondary CC. The UE 102 may attempt to detect a sidelink synchronization signal (SLSS) from another UE 102 on the primary CC. The UE 102 may, if the SLSS from the other UE 102 is detected, determine, based on the detected SLSS, a common time synchronization for the primary CC and the secondary CC for vehicle-to-vehicle (V2V) sidelink transmissions in accordance with the carrier aggregation. The UE 102 may, if the SLSS from the other UE 102 is not detected: transmit an SLSS to enable determination of the common time synchronization for the primary CC and the secondary CC by the other UE 102. The SLSS may be transmitted on the primary CC. These embodiments are described in more detail below.

Figure 9:
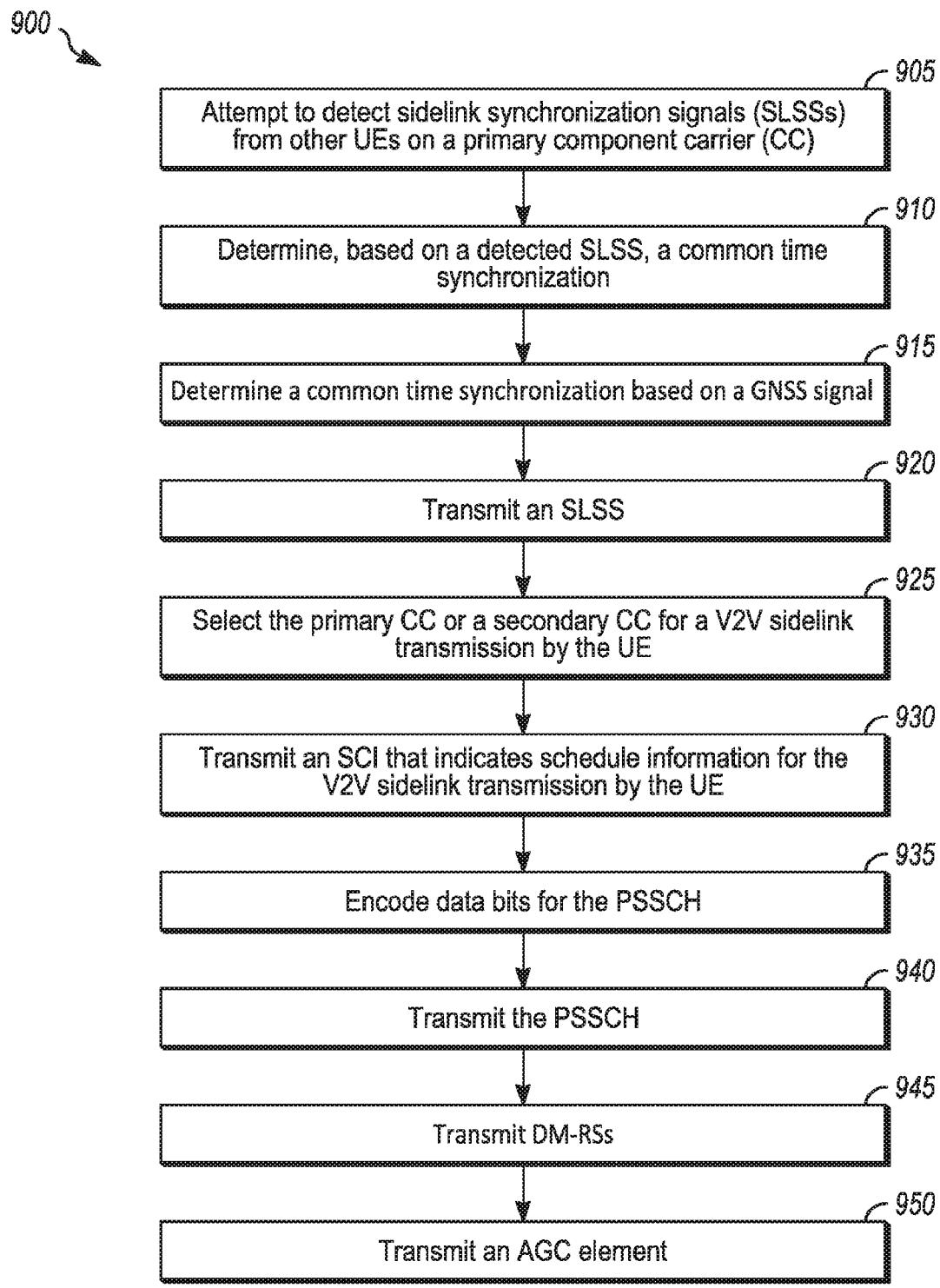
FIG. 9 illustrates the operation of a method of communication in accordance with some embodiments.

FIG. 9 illustrates the operation of a method of communication in accordance with some embodiments. In descriptions of the method 900 and other methods, reference may be made to one or more of FIGS. 1-17, although it is understood that the method 900 and other methods may be practiced with any other suitable systems, interfaces and components. In some cases, descriptions herein of one or more of the concepts, operations and/or techniques regarding one of the methods described herein (900 and/or other)

may be applicable to at least one of the other methods described herein (900 and/or other).

Some embodiments of the method 900 may include additional operations in comparison to what is illustrated in FIG. 9, including but not limited to operations described herein. Some embodiments of the method 900 may not necessarily include all of the operations shown in FIG. 9. In addition, embodiments of the method 900 are not necessarily limited to the chronological order that is shown in FIG. 9. In some embodiments, a UE 102 may perform one or more operations of the method 900, but embodiments are not limited to performance of the method 900 and/or operations of it by the UE 102. Accordingly, although references may be made to performance of one or more operations of the method 900 by the UE 102 in descriptions herein, it is understood that the gNB 105 and/or eNB 104 may perform one or more operations that may be the same as, similar to and/or reciprocal to one or more of the operations of the method 900, in some embodiments.

While the method 900 and other methods described herein may refer to eNBs 104, gNBs 105 or UEs 102 operating in accordance with 3GPP standards, 5G standards, NR standards and/or other standards, embodiments of those methods are not limited to just those eNBs 104, gNBs 105 or UEs 102 and may also be practiced on other devices, such as a Wi-Fi access point (AP) or user station (STA). In addition, the method 900 and other methods described herein may be practiced by wireless devices configured to operate in other suitable types of wireless communication systems, including systems configured to operate according to various IEEE standards such as IEEE 802.11. The method 900 and other methods described herein may also be applicable to an apparatus of a UE 102, an apparatus of an eNB 104, an apparatus of a gNB 105 and/or an apparatus of another device described above.

One or more of the messages described herein may be included in a standard and/or radio-protocol, including but not limited to Third Generation Partnership Project (3GPP), 3GPP Long Term Evolution (LTE), Fourth Generation (4G), Fifth Generation (5G), New Radio (NR) and/or other. The scope of embodiments is not limited to usage of elements that are included in standards, however.

It should also be noted that embodiments are not limited by references herein (such as in descriptions of the method 900 and/or other descriptions herein) to transmission, reception and/or exchanging of elements such as frames, messages, requests, indicators, signals or other elements. In some embodiments, such an element may be generated, encoded or otherwise processed by processing circuitry (such as by a baseband processor included in the processing circuitry) for transmission. The transmission may be performed by a transceiver or other component, in some cases. In some embodiments, such an element may be decoded, detected or otherwise processed by the processing circuitry (such as by the baseband processor). The element may be received by a transceiver or other component, in some cases. In some embodiments, the processing circuitry and the transceiver may be included in a same apparatus. The scope of embodiments is not limited in this respect, however, as the transceiver may be separate from the apparatus that comprises the processing circuitry, in some embodiments.

In some embodiments, the UE 102 may be configured for carrier aggregation using a primary component carrier (CC) and a secondary CC. In some embodiments, the UE 102 may be configured for carrier aggregation using a primary CC and one or more secondary CCs. One or more operations may be described herein for scenarios in which the carrier aggregation includes the primary CC and one secondary CC, but it is understood that embodiments are not limited to usage of one secondary CC. Some or all of those operations may be applicable to other scenarios, including but not limited to: scenarios in which the carrier aggregation includes multiple secondary CCs; scenarios in which the carrier aggregation includes one or more secondary CCs; and/or other. One or more operations may be described herein for scenarios in which the carrier aggregation includes the primary CC and multiple secondary CCs, but it is understood that those operations may be applicable to scenarios in which the carrier aggregation includes the primary CC and one secondary CC.

In some embodiments, the UE 102 may generate and/or transmit signaling to indicate (to the gNB 105 and/or other component) that the UE 102 supports Sidelink Synchronization Signal (SLSS) transmission and reception for sidelink operation, including but not limited to discovery, communication and/or other. In some embodiments, the signaling may be included in a UE-EUTRA capability field of a UE-EUTRA-Capability information element (IE), although embodiments are not limited usage of this field or this element. It should be noted that some embodiments may not necessarily include this operation.

At operation 905, the UE 102 may attempt to detect one or more sidelink synchronization signals (SLSSs). In some embodiments, the UE 102 may attempt to detect the one or more SLSSs on the primary CC, although the scope of embodiments is not limited in this respect. In some embodiments, the UE 102 may attempt to detect an SLSS from another UE 102 on the primary CC. In some embodiments, the UE 102 may attempt to detect SLSSs from other UEs 102 on the primary CC.

In some embodiments, the primary CC may be allocated for V2V sidelink transmissions of control information or data. The one or more secondary CCs may be allocated for V2V sidelink transmissions of data. For instance, transmission of control information may be restricted to the primary CC, in some embodiments. In some embodiments, the UE 102 may refrain from transmission of SLSSs on the one or more secondary CCs. In some embodiments, the primary CC, secondary CC and/or other CC may transmit data and/or shared channel as part of the V2V sidelink transmission. In some embodiments, a V2V sidelink transmission may include a V2V sidelink data/shared channel transmission in which data is transmitted.

It should be noted that references herein to a "primary CC" and/or "secondary CC" are not limiting. Such references may be used for clarity, in some cases. One or more operation and/or techniques may be described herein as performed on a primary CC, but it is understood that some or all of those operations and/or techniques may be performed on a synchronization CC, an anchor CC and/or other type of CC, in some embodiments. One or more operation and/or techniques may be described herein as performed on a secondary CC, but it is understood that some or all of those operations and/or techniques may be performed on a non-synchronization CC, a non-anchor CC and/or other type of CC, in some embodiments. In some embodiments, an operation described herein may be performed in accordance with a carrier aggregation of a primary CC and one or more secondary CCs, but the operation may be performed, in some embodiments, in accordance with a carrier aggregation of: a synchronization CC and one or more secondary CCs; a synchronization CC and one or more non-synchronization CCs; a synchronization CC and one or more CCs that are not allocated for synchronization; an anchor CC and one or more secondary CCs; and/or other.

In some embodiments, the primary CC and the one or more secondary CCs may be configurable for one or more of: different service types per CC, different service priorities per CC, different TTI types per CC (including but not limited to short TTI, legacy TTI and/or other), different numerology per CC (for instance, 15/30/60 kHz subcarrier spacing) and/or other.

In some embodiments, the UE 102 may attempt to detect the one or more SLSSs in predetermined time-frequency resources of the primary CC allocated for SLSS transmissions. In some embodiments, the UE 102 may attempt to detect the one or more SLSSs in predetermined time resources and/or predetermined frequency resources of the primary CC, wherein the predetermined time resources and/or predetermined frequency resources may be allocated for SLSS transmissions, including but not limited to SLSS transmissions on a subset of aggregated CCs. It should be noted that two or more CCs of the carrier aggregation may be referred to herein, without limitation, as "aggregated CCs". In some cases, one or more CCs of the carrier aggregation may be a subset of aggregated CCs.

At operation 910, the UE 102 may determine a common time synchronization. In some embodiments, the UE 102 may determine the common time synchronization and/or common frequency synchronization for V2V sidelink transmissions across aggregated CCs. In some embodiments, the UE 102 may determine the common time synchronization for the primary CC and the one or more secondary CCs based on one or more detected SLSSs transmitted on different CCs. In a non-limiting example, a common DFN value and common offset across aggregated CCs may be used. For instance, the UE 102 may use the one or more detected SLSSs if the UE 102 successfully detects the one or more SLSSs at operation 905, in some cases. It should be noted that embodiments are not limited to determination of the common time synchronization, as one or more techniques described herein may be applicable to determination of common time synchronization and/or common frequency synchronization.

At operation 915, the UE 102 may determine a common time synchronization based on a global navigation satellite system (GNSS) technique. In some embodiments, the UE 102 may detect one or more GNSS signals, and may determine one or more of the following based on detected GNSS signal(s): a reference timing, the common time synchronization, and/or other. In a non-limiting example, the UE 102 may determine a reference timing based on a GNSS timing. The UE 102 may apply the determined reference timing to multiple CCs, in some cases. For instance, a common DFN value and offset across aggregated CCs may be used.

In some embodiments, the UE 102 may determine the common time synchronization based on the GNSS technique if the UE 102 does not successfully detect one or more SLSSs at operation 905, although the scope of embodiments is not limited in this respect. In some embodiments, the UE 102 may determine the common time synchronization based on the GNSS technique. The UE 102 can successfully detect GNSS timing from one or more SLSSs transmitted by UEs deriving timing from GNSS. In some embodiments, the UE 102 may attempt to detect a reference signal from a gNB 105, and may determine the common time synchronization based on the detected reference signal.

In some cases, the UE 102 may synchronize to the gNB 105 and/or GNSS, and may transmit an SLSS. In some of those cases, it may not be necessary for the UE 102 to detect an SLSS (such as an SLSS from another UE 102).

At operation 920, the UE 102 may transmit an SLSS. In some embodiments, the UE 102 may transmit the SLSS to enable determination of the common time synchronization for aggregated CCs by one or more other UEs 102. In some embodiments, the UE 102 may transmit the SLSS on the primary CC. In some embodiments, the UE 102 may transmit the SLSS if the UE 102 does not successfully detect one or more SLSSs at operation 905, although the scope of embodiments is not limited in this respect. It should be noted that embodiments are not limited to transmission of the SLSS on the primary CC, as another CC may be used in some embodiments.

At operation 925, the UE 102 may select the primary CC or one of the secondary CCs for a V2V sidelink transmission by the UE 102. In a non-limiting example, the UE 102 may select the primary CC or one of the secondary CCs based at least partly on a service type of the V2V sidelink transmission and service types supported by the primary CC and the secondary CCs. In another non-limiting example, the UE 102 may select the primary CC or one of the secondary CCs based at least partly on a service priority of the V2V sidelink transmission and service priorities supported by the primary CC and the secondary CCs. In another non-limiting example, the UE 102 may select the primary CC or one of the secondary CCs based at least partly on traffic loadings of the primary CC and the secondary CCs. Embodiments are not limited to these example criteria for the selection of the CC at operation 925.

At operation 930, the UE 102 may transmit an SCI that indicates schedule information for the V2V sidelink transmission by the UE 102. In a non-limiting example, the UE 102 may transmit the SCI in accordance with same-carrier scheduling, wherein the SCI is to be transmitted on the same CC selected for the V2V sidelink transmission by the UE 102. In another non-limiting example, the UE 102 may transmit the SCI in accordance with cross-carrier scheduling, wherein the SCI is to be transmitted on a CC different from the CC selected for the V2V sidelink transmission by the UE 102. In some cases, data may be duplicated on multiple CCs as part of a V2V sidelink transmission in accordance with carrier aggregation of the multiple CCs. In some cases, different data may be sent on different CCs as part of a V2V sidelink transmission in accordance with carrier aggregation of multiple CCs.

In some embodiments, the UE 102 may transmit a physical sidelink control channel (PSCCH) that includes the SCI. Embodiments are not limited to usage of the PSCCH, however, as the UE 102 may transmit other elements that include the SCI, in some embodiments.

At operation 935, the UE 102 may encode data bits for a physical sidelink shared channel (PSSCH). At operation 940, the UE 102 may transmit the PSSCH.

In some embodiments, the UE 102 may transmit one or more PSSCHs (and/or other elements) on multiple CCs in accordance with the carrier aggregation. In some embodiments, the UE 102 may transmit one or more PSSCHs (and/or other elements) concurrently on multiple CCs in accordance with the carrier aggregation. In some embodiments, the UE 102 may transmit one or more PSSCHs (and/or other elements) on multiple CCs based on the common time synchronization and in accordance with the carrier aggregation.

In a non-limiting example, the UE 102 may select either the primary CC or one of the secondary CCs, and may transmit a PSSCH on the selected CC.

In another non-limiting example, the UE 102 may encode, based on first data bits, a first PSSCH for a first V2V sidelink transmission on the primary CC in accordance with a legacy transmission time interval (TTI). The UE 102 may encode, based on second data bits, a second PSSCH for a second V2V sidelink transmission on a secondary CC in accordance with a short TTI that is shorter than the legacy TTI.

In another non-limiting example, the UE 102 may encode a first PSSCH for a first V2V sidelink transmission to a legacy UE 102 and may encode a second PSSCH for a second V2V sidelink transmission to a non-legacy UE 102. For instance, the first V2V sidelink transmission to the legacy UE 102 may be on the primary CC and the second V2V sidelink transmission to the non-legacy UE 102 may be on a secondary CC, although the scope of embodiments is not limited in this respect.

It should be noted that references to a non-legacy UE 102 are not limiting. In some embodiments, an enhanced UE 102, a UE 102 configured for NR operation, a UE 102 configured for 5G operation and/or other type of UE 102 may be used. In a non-limiting example, an operation that is performed by a non-legacy UE 102 in descriptions herein may be performed by an enhanced UE 102, a UE 102 configured for NR operation, a UE 102 configured for 5G operation and/or other type of UE 102, in some embodiments. In another non-limiting example, some scenarios may include communication between a component and a non-legacy UE 102 in descriptions herein. In some embodiments, same or similar scenarios may include communication between the component and an enhanced UE 102, a UE 102 configured for NR operation, a UE 102 configured for 5G operation and/or other type of UE 102.

At operation 945, the UE 102 may transmit one or more demodulation reference signals (DM-RSs). At operation 950, the UE 102 may transmit an automatic gain control (AGC) element In some embodiments, the UE 102 may encode a PSSCH based on a block of data bits. The UE 102 may encode the PSSCH for a V2V sidelink transmission by the UE 102. The UE 102 may encode demodulation reference signals (DM-RSs) for the V2V sidelink transmission by the UE 102. The UE 102 may map the PSSCH and the DM-RSs to one or more physical resource blocks (PRBs) that are allocated for V2V sidelink transmission in a sub-frame. Embodiments are not limited to usage of PRBs, as the elements described above may be mapped to other types of frequency resources, in some embodiments. In some embodiments, the PSSCH and a PSCCH may be transmitted in a same sub-frame and DM-RSs may be included in the PSSCH/PSCCH, although the scope of embodiments is not limited to this arrangement.

Several non-limiting examples are given below. It is understood that these examples are not exhaustive. In some embodiments, a combination (in whole or in part) of one or more of these examples may be used. In some embodiments, one or more techniques similar to techniques included in one or more of these examples may be used. Although the examples may include control logic based on comparison of a modulation order with 64 quadrature amplitude modulation (64-QAM), embodiments are not limited to such techniques and are also not limited to usage of (4-QAM for such comparisons.

In a non-limiting example, if the PSSCH is encoded with a modulation order lower than 64 quadrature amplitude modulation (64-QAM), the DM-RSs may be mapped to a plurality of symbol periods of the sub-frame. If the PSSCH is encoded with a modulation order of at least 64-QAM, the DM-RSs may be further mapped to one or more additional symbol periods of the sub-frame. For instance, if the PSSCH is encoded with the modulation order of at least 64-QAM, the DM-RSs may be mapped to: the symbol periods to which the DM-RSs are mapped if the PSSCH is encoded with the modulation order lower than 64-QAM; and to one or more additional symbol periods of the sub-frame.

In another non-limiting example, the plurality of symbol periods (to which the DM-RSs are mapped if the PSSCH is encoded with a modulation order lower than 64-QAM) may include four symbol periods, the sub-frame may span one millisecond (msec) and may include 14 symbol periods, and each PRB may include 12 resource elements (REs). Embodiments are not limited to these example numbers, as other numbers may be used in some embodiments.

In another non-limiting example, if the PSSCH is encoded with the modulation order lower than 64-QAM, the UE 102 may map the DM-RSs to resource elements (REs) of the PRBs in the plurality of symbol periods. If the PSSCH is encoded with the modulation order of at least 64-QAM, the UE 102 may map the DM-RSs to: the same REs of the PRBs in the same plurality of symbol periods to which the DM-RSs are mapped if the PSSCH is encoded with the modulation order lower than 64-QAM, and at least a portion of REs in the one or more additional symbol periods.

In another non-limiting example, if the PSSCH is encoded with the modulation order lower than 64-QAM, the UE 102 may encode the PSSCH in accordance with a rate-matching in which the plurality of symbol periods is excluded from an encode operation. If the PSSCH is encoded with the modulation order of at least 64-QAM, the UE 102 may encode the PSSCH in accordance with a rate-matching in which: the plurality of symbol periods is excluded from the encode operation, and a portion of REs of one or more additional symbol periods are excluded from the encode operation. In some embodiments, the UF 102 may exclude the last chronological symbol period of the subframe from the encode operation for the rate-matching to encode the PSSCH.

In another non-limiting example, if the PSSCH is encoded with the modulation order of at least 64-QAM, the UE 102 may transmit, in a first chronological symbol period of the sub-frame, an AGC element to enable AGC at other UEs 102. The UE 102 may exclude the first chronological symbol period from the encode operation for the rate-matching to encode the PSSCH.

In some embodiments, an apparatus of a UE 102 may comprise memory. The memory may be configurable to store information that identifies a common time synchronization. The memory may store one or more other elements and the apparatus may use them for performance of one or more operations. The apparatus may include processing circuitry, which may perform one or more operations (including but not limited to operation(s) of the method 900 and/or other methods described herein). The processing circuitry may include a baseband processor. The baseband circuitry and/or the processing circuitry may perform one or more operations described herein, including but not limited to encoding of the SLSS. The apparatus of the UE 102 may include a transceiver to transmit the SLSS. The transceiver may transmit and/or receive other blocks, messages and/or other elements.

Figure 10:
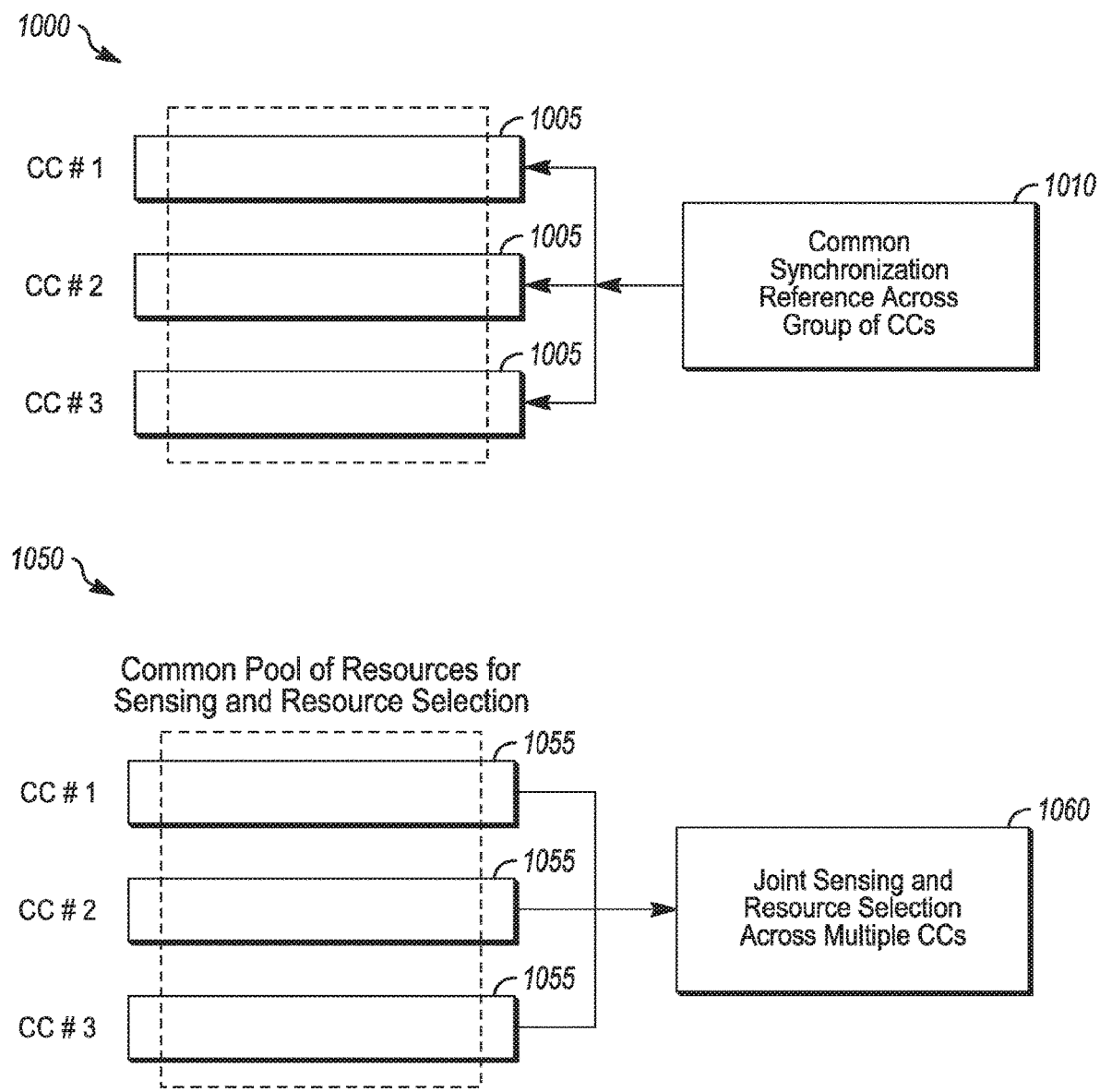
FIG. 10 illustrates an example arrangement that may be used for carrier aggregation in accordance with some embodiments.
Figure 11:
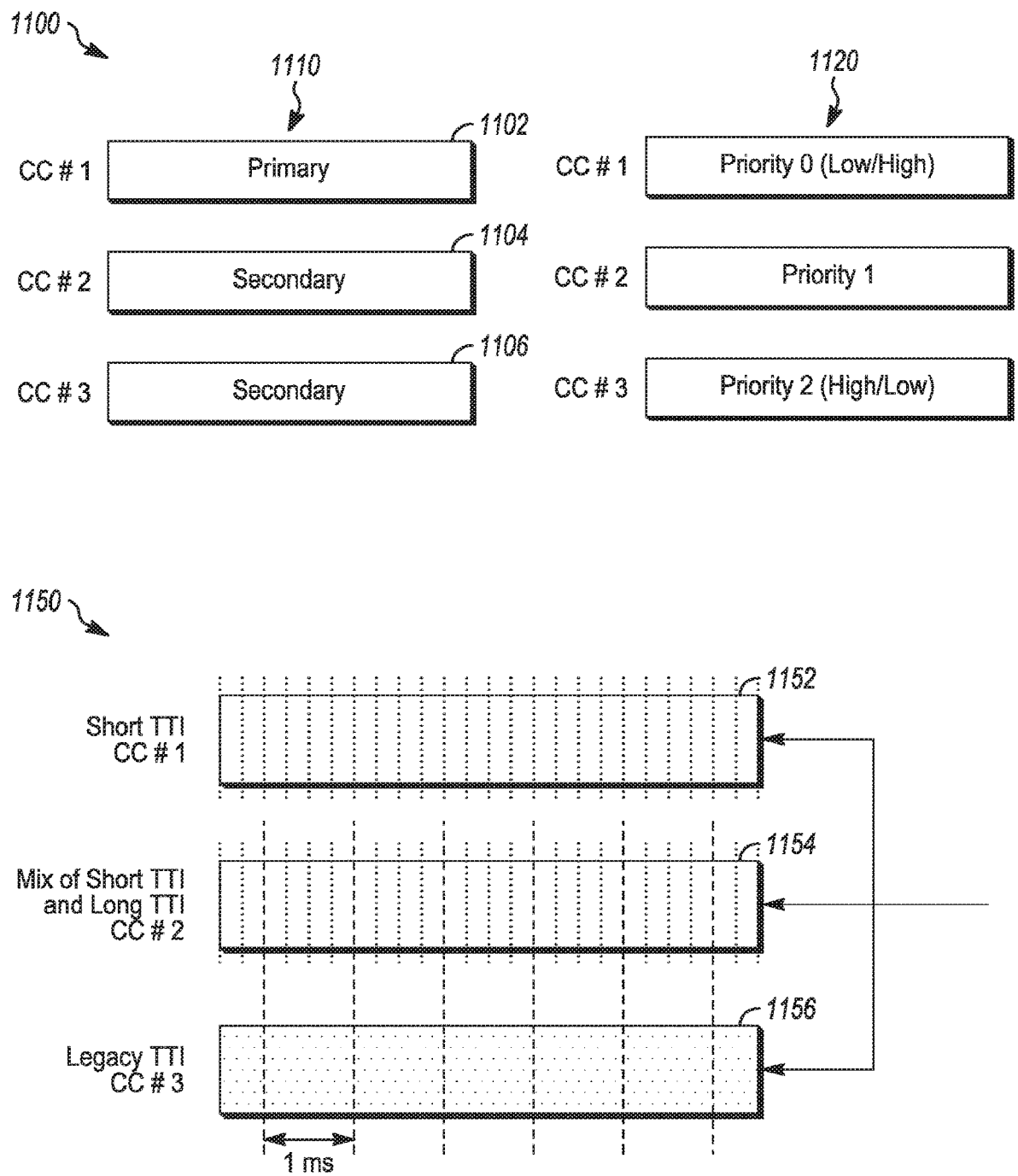
FIG. 11 illustrates example arrangements that may be used for carrier aggregation in accordance with some embodiments.
Figure 12:
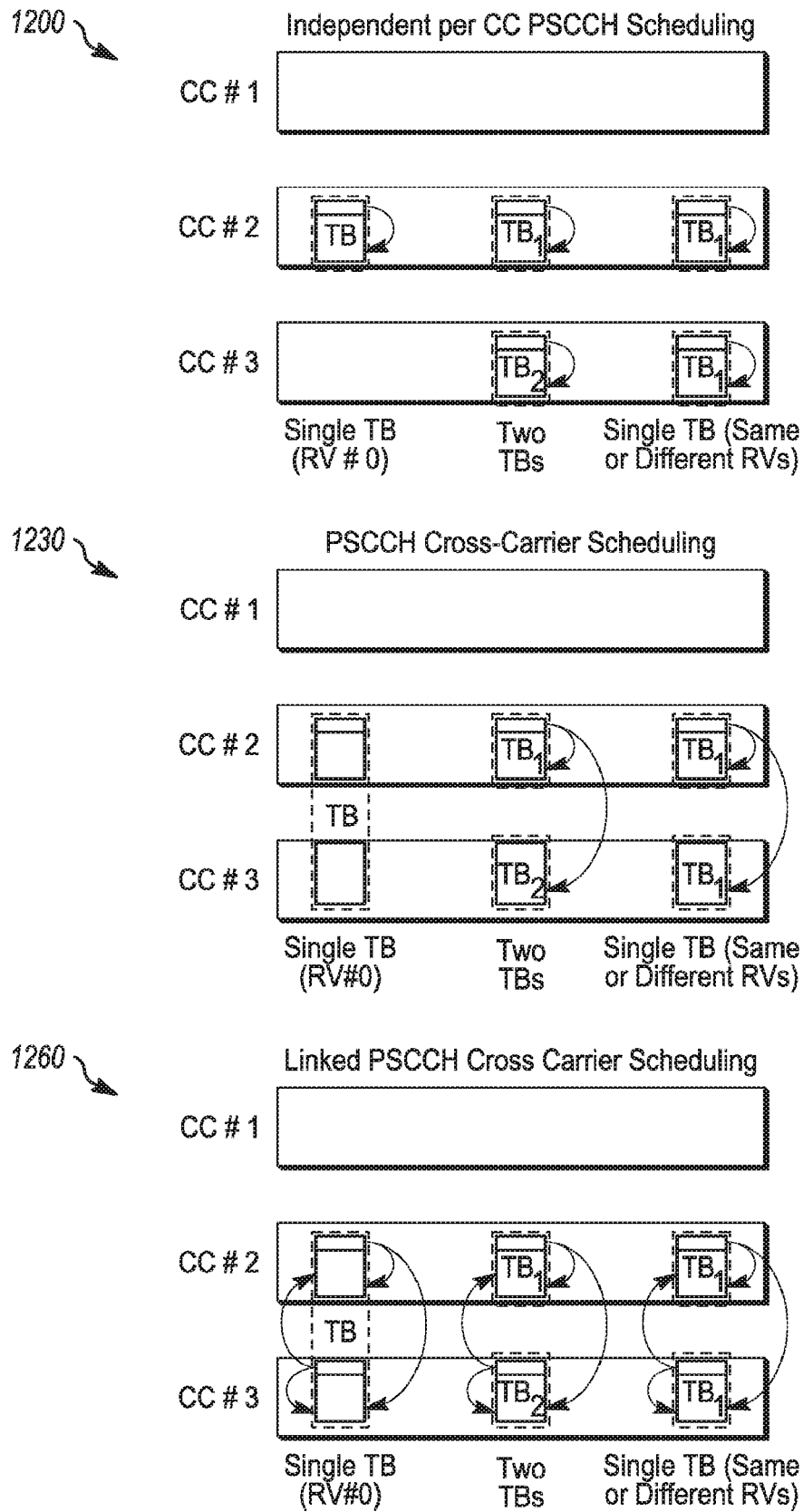
FIG. 12 illustrates example arrangements that may be used for carrier aggregation in accordance with some embodiments.
Figure 13:
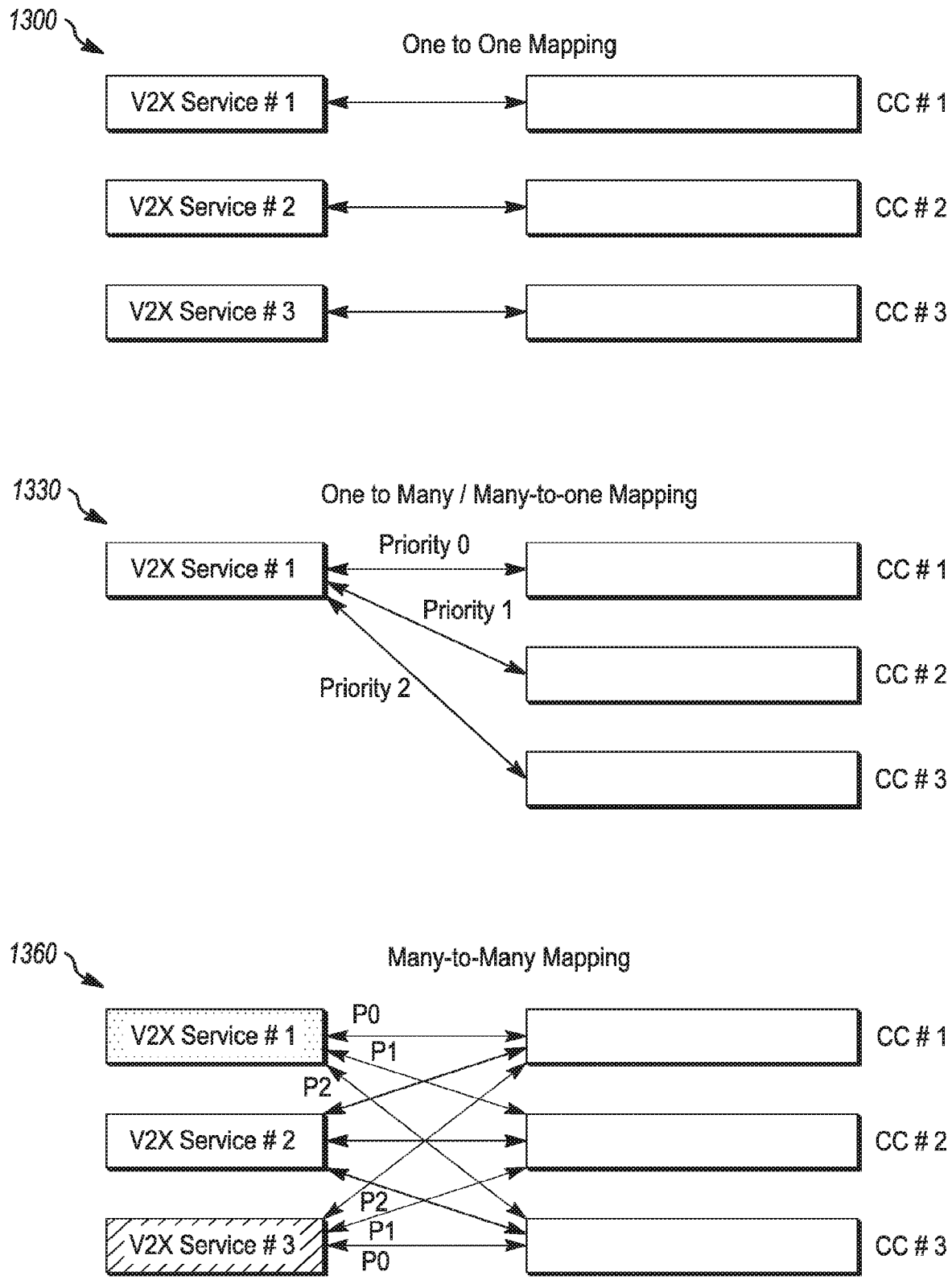
FIG. 13 illustrates example arrangements that may be used for carrier aggregation in accordance with some embodiments.
Figure 14A:
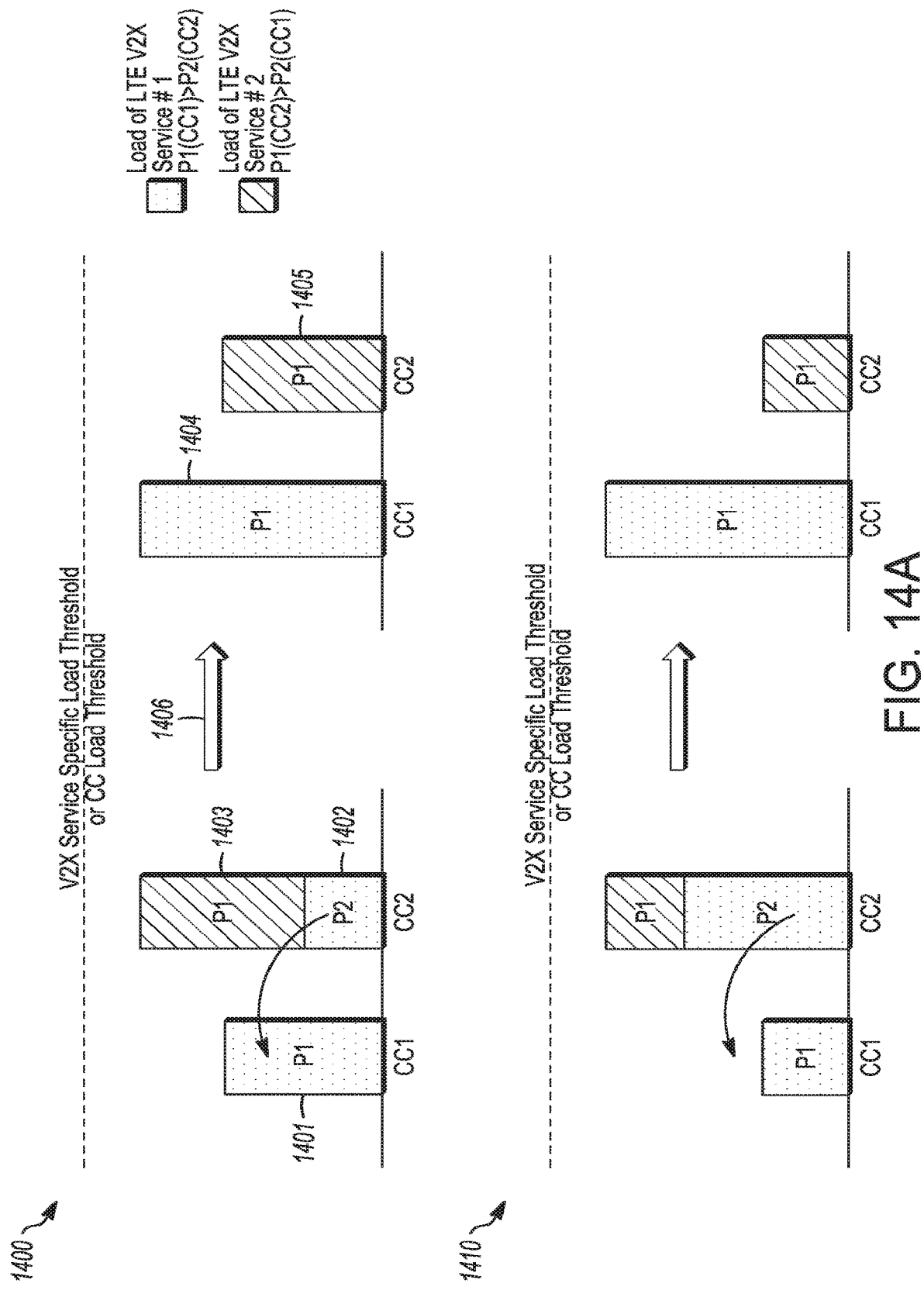
FIG. 14A and FIG. 14B illustrate example arrangements that may be used for carrier aggregation in accordance with some embodiments.
Figure 14B:
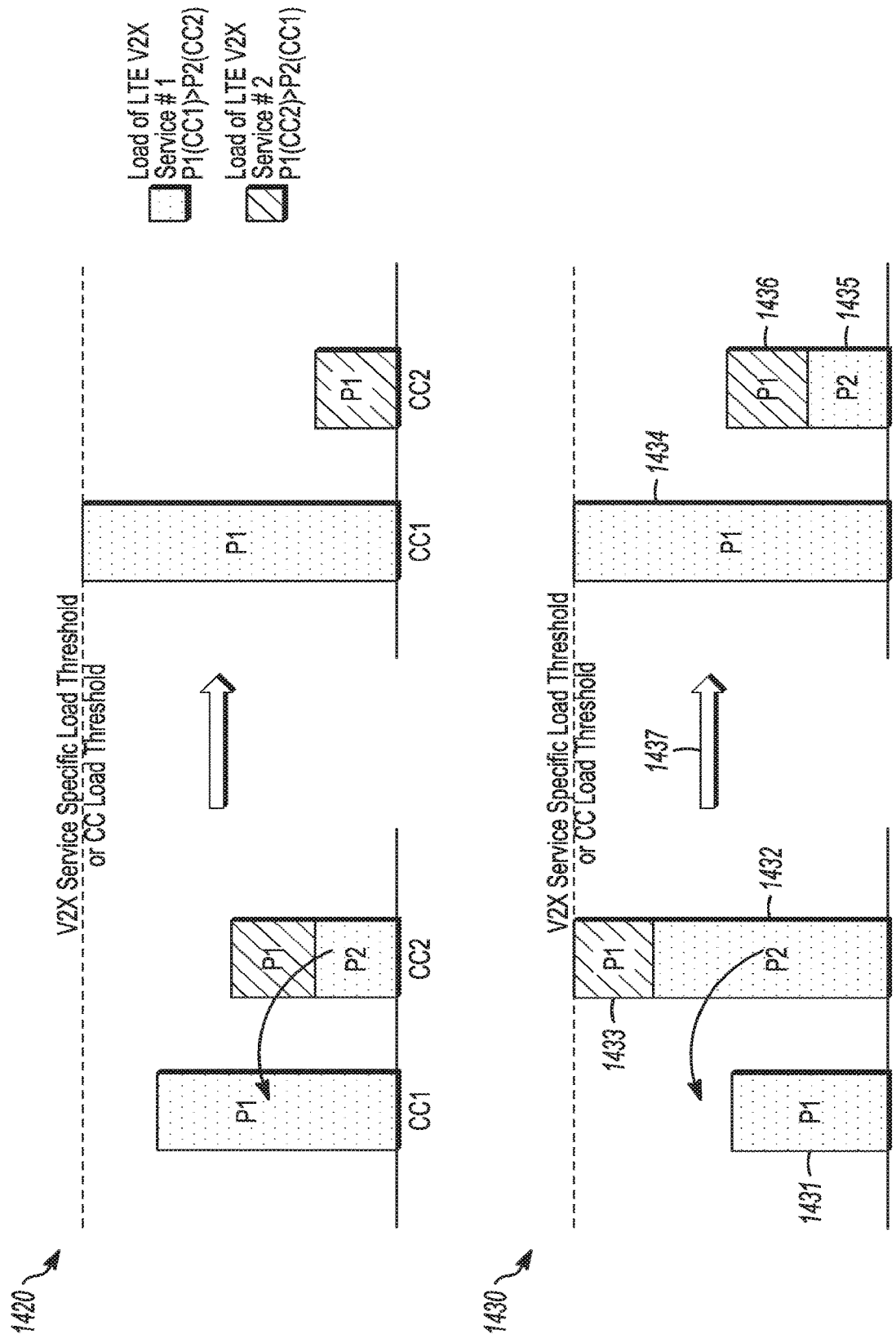
Figure 15A:
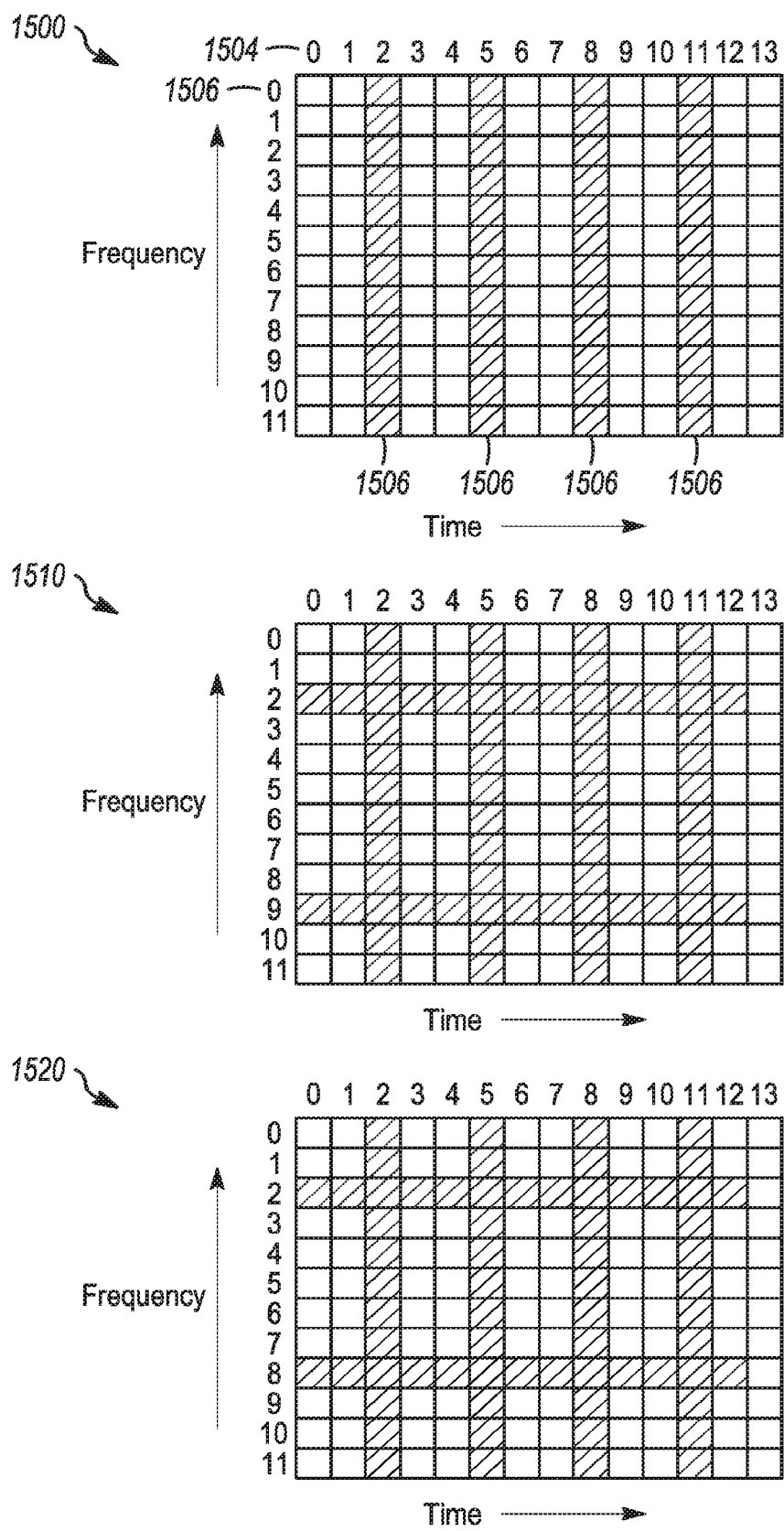
FIG. 15A and FIG. 15B illustrate examples physical resource block (PRB) formats that may be used in accordance with some embodiments.
Figure 15B:
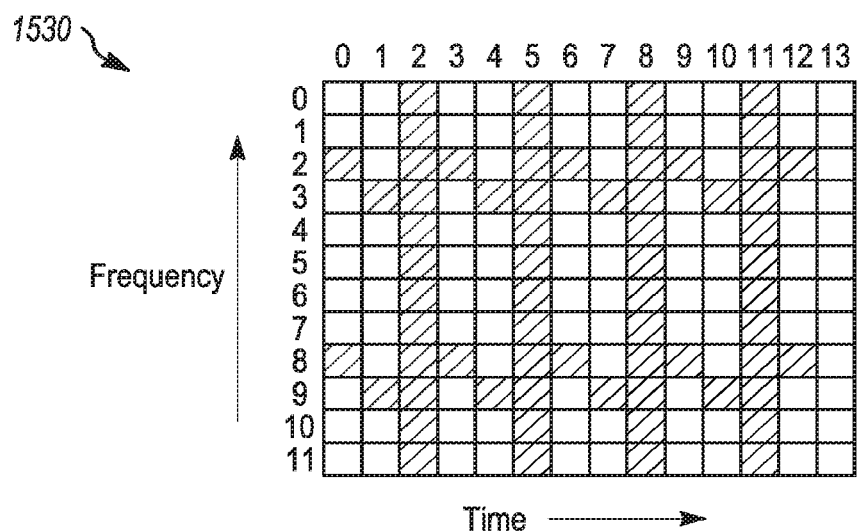
Figure 15B:
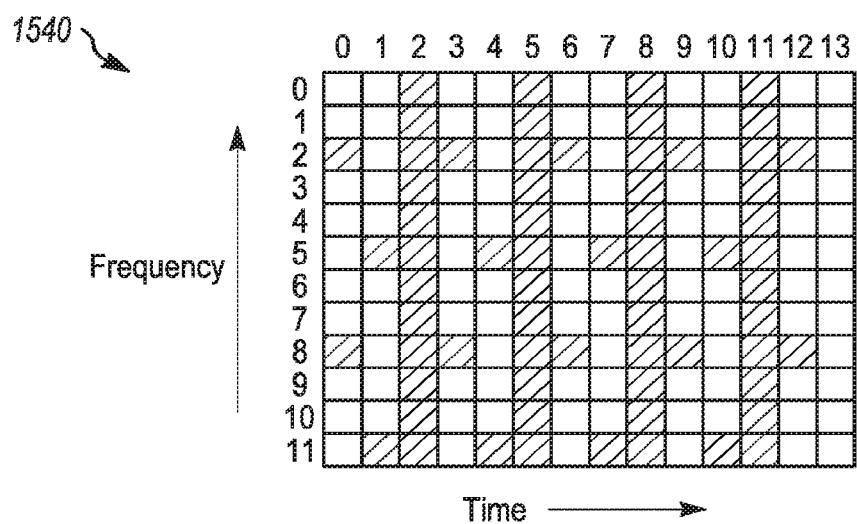
Figure 16:
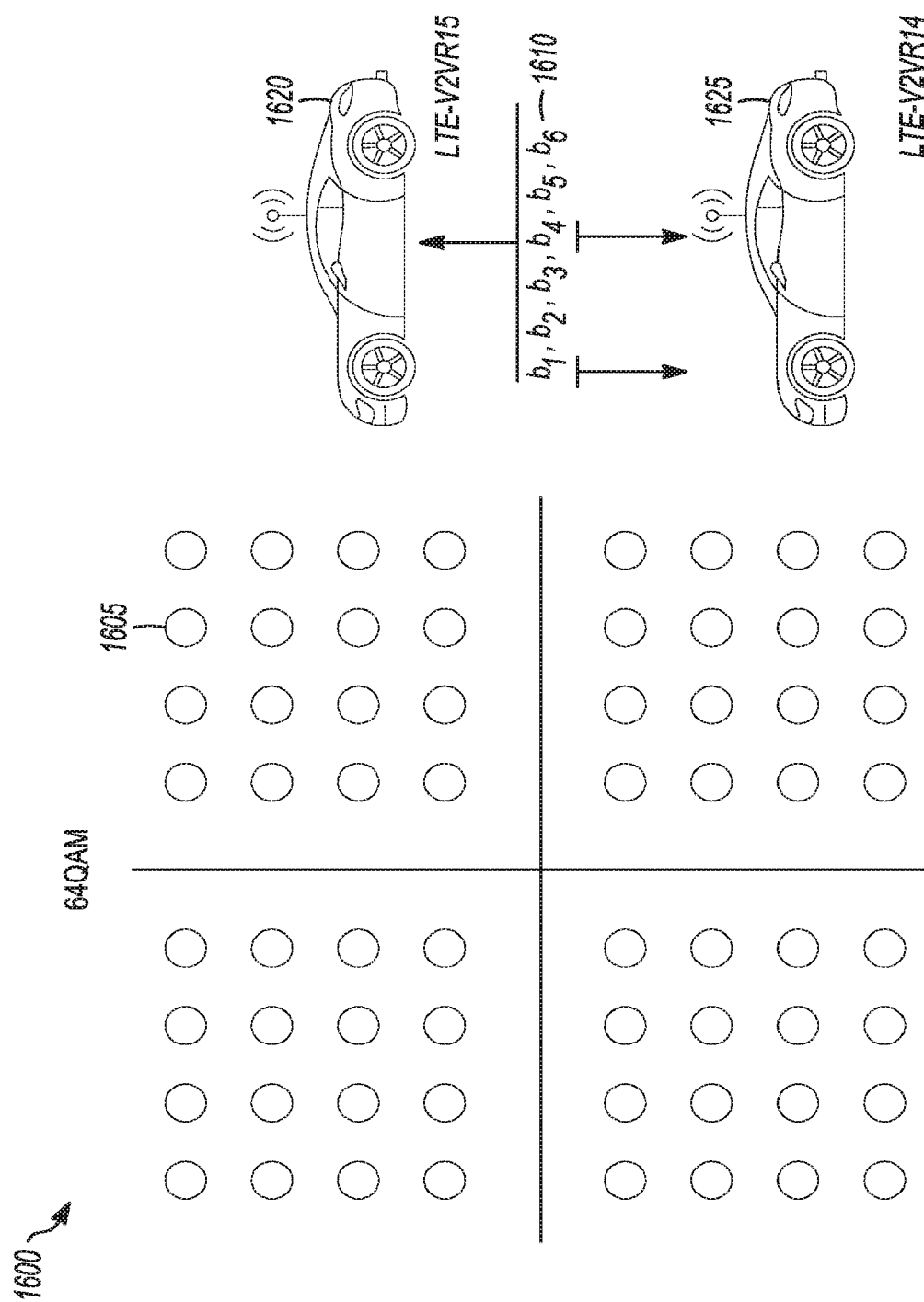
FIG. 16 illustrates example modulation that may be used in accordance with some embodiments.
Figure 17:
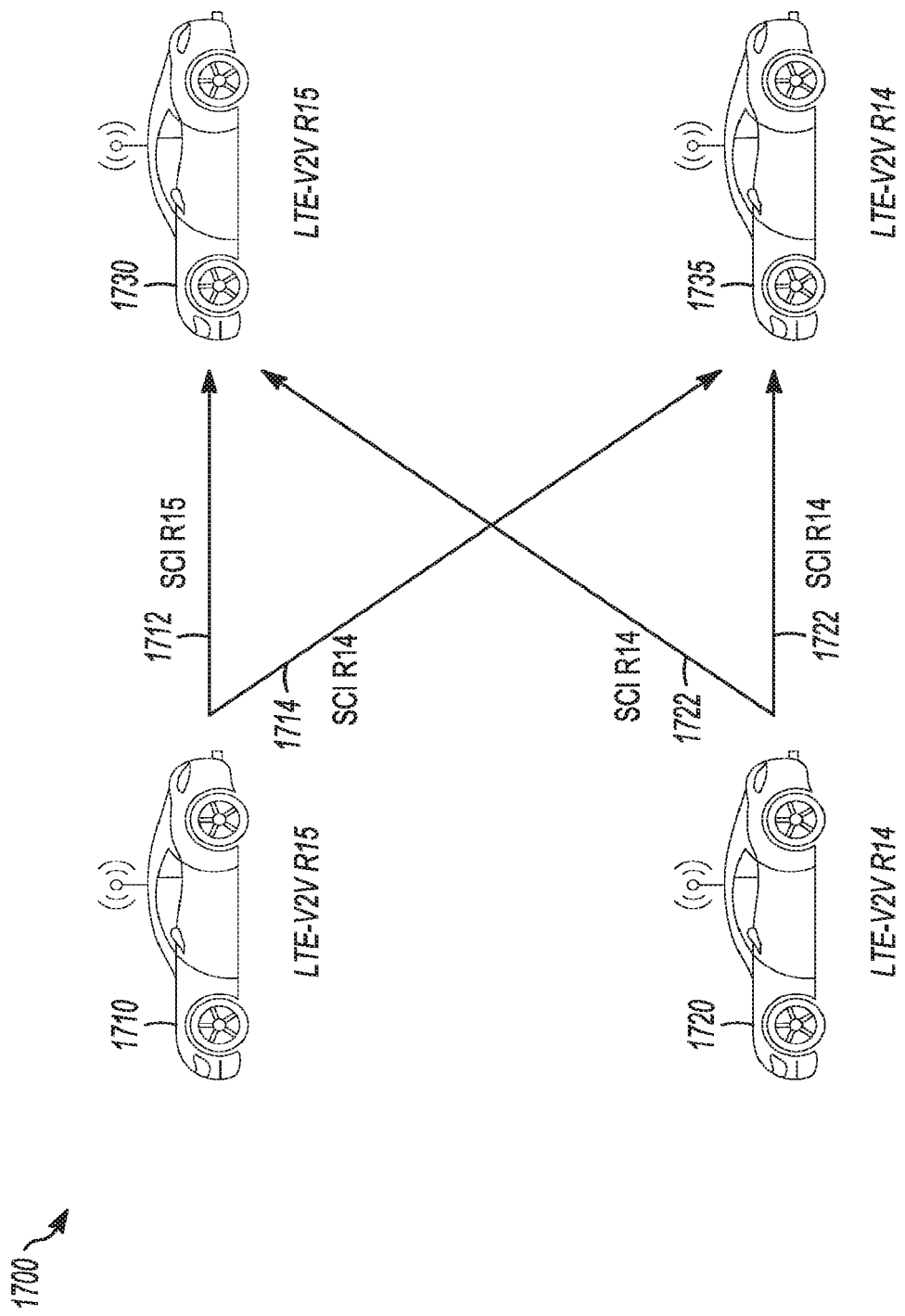
FIG. 17 illustrates example messages that may be exchanged in accordance with some embodiments.

FIG. 10 illustrates an example arrangement that may be used for carrier aggregation in accordance with some embodiments. FIG. 11 illustrates example arrangements that may be used for carrier aggregation in accordance with some embodiments. FIG. 12 illustrates example arrangements that may be used for carrier aggregation in accordance with some embodiments. FIG. 13 illustrates example arrangements that may be used for carrier aggregation in accordance with some embodiments. FIG. 14A and FIG. 14B illustrate example arrangements that may be used for carrier aggregation in accordance with some embodiments. In references herein, "FIG. 14" may include FIG. 14A and FIG. 14B. FIG. 15A and FIG. 15B illustrate examples physical resource block (PRB) formats that may be used in accordance with some embodiments. In references herein, "FIG. 15" may include FIG. 15A and FIG. 15B. FIG. 16 illustrates example modulation that may be used in accordance with some embodiments. FIG. 17 illustrates example messages that may be exchanged in accordance with some embodiments.

It should be noted that the examples shown in FIGS. 10-17 may illustrate some or all of the concepts and techniques described herein in some cases, but embodiments are not limited by the examples. For instance, embodiments are not limited by the name, number, type, size, ordering, arrangement and/or other aspects of the operations, messages, gNBs 105, UEs 102, time resources, frequency resources, carriers and other elements as shown in FIGS. 10-17. Although some of the elements shown in the examples of FIGS. 10-17 may be included in a 3GPP LTE standard, 5G standard, NR standard and/or other standard, embodiments are not limited to usage of such elements that are included in standards.

In some embodiments, one or more of the following may be used to enable carrier aggregation on a sidelink (which may be applicable for V2V communication and/or other communication): synchronization of multiple sidelink component carriers (CC) from common synchronization reference with subframe boundaries alignment in time; introduction of anchor CC for SLSS based synchronization; sharing of resource pools across CCs, joint sensing and resource selection across multiple component carriers (CCs); CC prioritization based on V2X service type or priority assigned to V2X service for each CC; sidelink control information signaling enhancements to enable sidelink cross-carrier operation to increase peak data rate or reliability of V2V communication; cross-carrier V2X service load balancing and congestion control; and/or other.

In some embodiments, single and multiple transceiver UEs 102 may be used to provide V2X services on multiple sidelink CCs. The V2X carrier aggregation design may support flexible amount of sidelink CCs supported by UE 102. In addition, the sidelink carrier aggregation may be separately configured for transmission and reception (that is, the amount of CCs supported for reception and transmission by UE 102 may be different). In that case, the UE 102 may be expected to receive on multiple CCs, while sharing its TX chains among different sidelink CCs.

In some embodiments, various V2X services may differ in terms of spectrum allocation in different geographic areas. For instance, a mapping of V2X service types to frequency bands may be country/region specific. In some embodiments, a same V2X service type may be mapped to multiple CCs or vice versa. Multiple V2X services may be mapped to a single CC or across multiple CCs.

In some embodiments, mapping of V2X services to sidelink CCs may include one or more of: a same V2X service may be mapped to a set of sidelink CCs; multiple V2X services may be mapped to a single sidelink CC; and/or other.

In some embodiments, a V2X sidelink carrier aggregation (CA) arrangement may support flexible/different amount of sidelink CCs for transmission and reception.

In some embodiments, synchronization for sidelink CA may be performed in accordance with a synchronized group of component carriers. For multi-carrier sidelink operation, it may be beneficial to synchronize all sidelink CCs. Common timing reference and synchronization source priority rules may be used across multiple sidelink CCs. A common sync reference (such as GNSS and/or other) may be used to provide synchronization in time and frequency for all CCs. Referring to FIG. 10, in the scenario 1000, common synchronization (as indicated by 1010) may be performed for the multiple sidelink CCs 1005.

In some embodiments, an anchor sidelink CC may be defined to provide SLSS based synchronization across a group of synchronous sidelink CCs, while other sidelink CCs may have allocated synchronization resources for SLSS (Sidelink Synchronization Signal) transmission by UEs 102 but not used for SLSS transmission/reception.

In some embodiments, non-synchronized CCs may be used. In a non-limiting example, one or more legacy procedures (including but not limited to procedures of a 3GPP LTE protocol, such as Release 14 or other) may be used.

In some embodiments, a V2V sensing and resource selection procedure may be used per CC (that is, each CC may be processed independently from transmission and reception perspective). If multiple sidelink CCs are aggregated, the sensing and resource selection procedure may operate across a preconfigured group of sidelink CCs. In this case, the PSCCH/PSSCH resource pool may be defined across the group of sidelink CCs (that is, a common pool across the group of carriers). In some embodiments, the resource configuration may be CC specific. In some cases the resource selection across CCs can be enhanced in a way that resources/subframes selected on one CC based on resource selection procedure are excluded from candidate resource sets on other aggregated CCs to facilitate operation of UEs with reduced TX capabilities or minimize impact of half-duplex. In some cases, the CC specific resource pools (such as for PSCCH, PSSCH and/or other) may be combined into a single pool of resources (sidelink CA pool of resources). Referring to FIG. 10, in the scenario 1050, joint sensing and resource selection across multiple sidelink CCs 1055 may be performed, as indicated by 1060.

In some embodiments, UEs 102 may be tuned to one or more CCs at a given time. The same data may be transmitted by enhanced UEs 102 across multiple CCs. For instance, the UE 102 may select at least one resource for transmission on a predefined CC (such as a primary carrier, which is to be monitored by single transceiver chain UEs 102).

In some embodiments, a group of sidelink CCs may be divided into primary and secondary carriers. In some embodiments, a group of sidelink CCs may be divided into primary and secondary carriers may be ranked based on a priority for specific V2X service type. In some embodiments, a primary sidelink CC (anchor CC) within a group of sidelink carriers may be used for one or more of the following: SLSS based synchronization; transmission of control signaling; and/or other. Such control signaling may be used for one or more of: to indicate service related information delivered across CCs within a group of carriers; to indicate time information that may facilitate multi-channel operation of UEs 102 with limited number of transceivers (for instance, follow transmission schedule across multiple CCs by switching to the required CC in a given time); and/or other.

In some embodiments, partitioning on primary or secondary carriers (or based on priority) can be also used for the purpose of congestion control and load balancing across CCs based on V2X service or service type priority per CC. Referring to the example 1100 in FIG. 11, the CCs #1, #2, and #3 are labeled as 1102, 1104, 1106. As indicted by 1110, the CCs 1102, 1104, 1106 may be classified as primary or secondary. As indicted by 1120, the CCs 1102, 1104, 1106 may be ranked in terms of a priority (0-2 in this example).

In some embodiments, sidelink CCs may have different configurations in terms of resource configuration. For instance, a resource pool configuration (such as a number of sub-channels per CC, a number of PRBs per sub-channel and/or other) may differ from one CC to another CC. In some embodiments, sidelink CCs may have different configurations in terms of TTI length configuration. Referring to FIG. 11, examples of such are shown by 1150. Some CCs may support short TTI (S-TTI) physical structures for sidelink operation (sPSCCH/sPSSCH), as indicated in the example 1152. Some CCs may support only legacy TTI (L-TTI), as indicated in the example 1156. Some CCs may support a combination of short and legacy TTI (sPSCCH/sPSSCH and PSCCH/PSSCH), as indicated in the example 1154. In some embodiments, different physical structures at different CCs may be used.

In some embodiments, sidelink cross-carrier scheduling may be enabled when multiple CCs are allocated for sidelink V2V communication. In this case, the control and data transmissions can be transmitted on the same or different CCs in accordance with various techniques. In a non-limiting example, legacy joint SCI and data transmission may be used. The legacy SCI and data transmission mode may enable enhanced UE V2V communication compatible with reception by legacy UEs 102. In another non-limiting example, enhanced data only transmission may be used. The shared channel transmission may be configured at the specific component carrier to increase system capacity and reliability. In some cases, data transmission may benefit from the full power transmission if there is no power sharing among CCs. Full power data transmission may not be possible in legacy mode, in some cases, wherein the SCI may be transmitted with power boosting and PSCCH and PSSCH transmission power may be shared. In another non-limiting example, enhanced SCI only transmission may be used. The PSCCH channel transmission may be configured on a single CC. This may increase control channel reliability and reduce overhead, in some cases.

In some embodiments, one or more of the following scheduling techniques may be used. In same carrier scheduling (an example of which is shown in 1200 of FIG. 12), the SCI on a CC may include information about transmission on that CC. In PSCCH cross-carrier scheduling (an example of which is shown in 1230 of FIG. 12), one SCI may signal multiple data transmissions on different CCs. In linked PSCCH cross carrier scheduling (an example of which is shown in 1260 of FIG. 12), SCIs transmitted on different carriers may indicate data allocations across multiple carriers. In some cases, one or more of the above options may have compatibility problem(s) with legacy UEs 102, which may have a single transceiver chain tuned to a specific CC. However, one or more of the above options may benefit UEs 102 with multiple transceivers, in some cases.

In some embodiments, the UE 102 may either transmit one TB spanning across multiple CCs or may transmit different TBs across different CCs. In terms of control signaling, the scheduling (PSCCH transmission) may be done either from a single CC (as in cross-carrier scheduling) or may be transmitted at each CC.

In some embodiments, duplication of the same TB transmission across multiple sidelink CCs may be used. In some embodiments, the duplication may be achieved through the increased PSCCH communication range by transmission of PSCCH on a given CC, if there is no power sharing among CCs. In this case, more UEs 102 may be able to receive PSCCH transmissions and may thus avoid using occupied PSSCH resources on other carriers. In some embodiments, the PSCCH channel may be configured on a single CC.

In some embodiments, from the LTE Uu air-interface perspective, the scheduling across a group of sidelink/PC5 carriers may be supported. Control signaling may support scheduling across multiple sidelink CCs. For instance, a DCI Format (such as 5X and/or other) may schedule sidelink transmissions across multiple CCs or multiple DCI Formats (such as 5A and/or other) may be transmitted.

In some embodiments, multi-channel (multi CC) operation for V2V communication may be used to serve different purposes, including but not limited to: to provide different V2X services on different carriers and to enable V2X service management across CCs; to provide efficient resource utilization/sharing across CCs by given service or multiple services; to perform multi-channel congestion control or load balancing, given that different CCs can have different loading; and/or other.

In some embodiments, a decision on which CC is to be used for transmission/reception by each transceiver and possibility of dynamic switching of the specific chain to particular CC may be performed. In some embodiments, mapping of V2X services (service types) to CC(s) may be based on physical layer design assuming that multiple services (service types) can share the same set of CCs and have different priorities to use particular CC. For instance, depending on interest to the specific V2X service type, the transceiver may be tuned to the default/primary CC for this V2X service and may use it for transmission and reception, unless it is triggered to switch to another CC based on CC switching conditions.

In some embodiments, a decision on selection of CC(s) for transmission of given service(s) may be based at least partly on loading or congestion control situation across multiple CCs. For instance, if the UE 102 monitors multiple CCs using multiple receiver chains, a decision on which CC to use for transmission to deliver a service under a loading conditions across a group of CCs may be performed. In some case, a rule and/or procedure may be used for such a decision.

Different scenarios are described below, and may be related to different options for mapping V2X services (service types) to CCs. They are referred to herein as Scenario 1, Scenario 2, and Scenario 3 for clarity, but such references are not limiting. In addition, references to mapping of V2X service are not limiting, as some of the techniques described below may be applicable to scenarios in which other type of services are mapped.

In Scenario 1, a one-to-one mapping may be used. In this case, a single V2X service may be mapped to a single V2X CC. That is, a single CC may be allocated to a particular service. Such services may include, but are not limited to LTE-V2X specific services, safety-related services and/or other. A non-limiting example 1300 of a one-to-one mapping is shown in FIG. 13.

In Scenario 2, a many-to-one mapping may be used. In this case, a single V2X service may be mapped to multiple CCs or multiple V2X services may be mapped to single CC. A non-limiting example 1330 of a one-to-many mapping (and/or many-to-one mapping) is shown in FIG. 13.

In Scenario 3, a many-to-many mapping may be used. In this case, multiple CCs may be shared by multiple V2X services (for instance, different types of safety- and/or non-safety related services) with the same or different V2X service specific priorities per CC (which may be defined for each V2X service type per CC). A non-limiting example 1360 of a many-to-many mapping is shown in FIG. 13.

In some embodiments, in cases in which a one-to-one mapping is used, the UE 102 may tune its transceiver chains to sidelink CC of interest at a given time. A single transceiver UE 102 may tune to one CC at a time, but may process different CCs at different time intervals (for instance, support of different services in a TDM manner). The UE 102 equipped with multiple transceivers chains may support several V2X services at a time, by processing several CCs. The congestion control and load balancing may be performed independently per each CC in this scenario.

In some embodiments, in cases in which a many-to-one mapping is used, a same V2X service may be delivered across multiple CCs (group of CCs) or a single CC may provide multiple V2X services. For the case when V2X service is delivered across multiple CCs, different congestion control and load balancing strategies are possible. In a non-limiting example, load balancing based CC selection (preferential access to CC with minimum CC loading). In this type of selection, load may be distributed across CCs. In addition, transmissions may be offloaded according to predefined rules (such as equal load, proportionally fair load and/or other). In another non-limiting example, priority based CC selection (preferential access to CC with higher priority for given service) may be used. A V2X service may have different priority to transmit on CCs. Therefore, the UE 102 may first transmit V2X service on a CC that has higher priority for given V2X service, unless this CC is overloaded/congested. In the latter case, the UE 102 may select the non-overloaded carrier with highest priority.

In some embodiments, one or more of the following metrics may be used for CC selection by the UE 102 for a given V2X service (service type): a V2X service (service type) priority for a given CC ($P_{SERVICE-CC}$), such as a priority of the given V2X service to utilize a given CC for transmission (service delivery); a V2X service load for the given CC ($L_{SERVICE-CC}$), which may be a V2X service specific metric characterizing load of given CC by given V2X service (for instance, each V2X service may estimate its contribution to the overall CC load); a V2X service overload indicator for the given CC ($L_{SERVICE-CC-OVLD}$), which may indicate that the given CC is overloaded by the given V2X service (for instance, in an overload condition, $L_{SERVICE-CC-OVLD}=L_{SERVICE-CC}>L_{SERVICE-CC-THR}$, and/or a load of the given service exceeds certain threshold); a CC overload indicator ($L_{CC-OVLD}$), which may indicate that the given CC is overloaded (which may not necessarily differentiate specific V2X services); a CC loading ($L_{CC}$), which may characterize the CC load by multiple V2X services (which may not necessarily differentiate specific V2X service); and/or other metric(s).

In some embodiments, in cases in which a many-to-many mapping is used, if each CC is associated with V2X service specific priority, for a given V2X service, the UE 102 may select the CC which has a highest priority for the given service (for instance, a primary CC for the given service), even if the overall loading in other CCs (such as secondary or lower priority CC) is lower.

Non-limiting examples are shown in FIG. 14. In the scenario 1400, a first service operates on both CC1 and CC2 (indicated by 1401 and 1402). The second service operates on CC2 (as indicated by 1403). This may be changed (as indicated by arrow 1406) to an arrangement in which the first service operates on CC1 (as indicated by 1404) and the second service operates on CC2 (as indicated by 1405).

In the scenario 1430, a first service operates on both CC1 and CC2 (indicated by 1431 and 1432). The second service operates on CC2 (as indicated by 1433). This may be changed (as indicated by arrow 1437) to another arrangement in which the first service operates on CC1 (as indicated by 1434) and CC2 (as indicated by 1435) and the second service operates on CC2 (as indicated by 1436). However, the load distribution of the first service in the first arrangement (indicated by 1431 and 1432) is different from the load distribution of the first service in the second arrangement (indicated by 1434 and 1435). The change in the load distribution of the first service may be performed in accordance with the threshold 1438. For instance, a loading of 1434 may be restricted to be less than the threshold 1438, and any remaining load (such as 1435) may remain on CC2.

Additional scenarios 1410 and 1420 are also shown in FIG. 14. These examples in FIG. 14 are not limiting, and may be extended to more than two CCs.

In some embodiments, the UE 102 may select, among all non-overloaded CCs, a CC with highest priority for a given V2X service, unless its service specific loading exceeds the predefined level for given V2X service. Otherwise, the UE 102 may switch to a CC with lower priority for the given service. If several CCs have equal V2X service specific priority, the UE 102 may use the CC with higher V2X service specific loading. Accordingly, overall CC loading may be considered.

In some embodiments, one or more relationships and/or priority rules, including but not limited to the following, may be used.

CC Overload Indicator ($L_{CC-OVLD}$)>V2X Service Specific Overload Indicator ($L_{SERVICE-CC-OVLD}$)>V2X Service Specific Priority ($P_{SERVICE-CC}$)>V2X Service Specific CC Load ($L_{SERVICE-CC}$)>Overall CC Loading ($L_{CC}$)

In some cases, V2X services may have different CC assignments in terms of service priority (that is, primary and secondary CC may be defined per V2X service type). The V2X service specific priority assignment may be useful technique from the channel loading perspective assuming that single V2X service may occupy multiple CCs. In cases in which no service specific priority is defined or cases in which equal priority is given for all CCs, the CC with higher V2X service specific load may be selected.

One or more of the following measurements may be used. In some embodiments, such measurements may be used in order to enable multi-CC operation with component carrier selection, although the scope of embodiments is not limited in this respect.

In a non-limiting example, a V2X service specific CC load may be used to estimate CC load for given V2X service. The metric may be based on an amount of resources occupied by transmissions for given V2X service within a predefined time interval (including but not limited to a time interval in which a received power is above a threshold). This metric may indicate an activity level of the given service in a given CC. In some embodiments, a service utilization ratio estimated at the receiver may be used to determine V2X service specific CC loading. In some embodiments, the V2X service or service type information may be signaled in SCI, MAC, RRC, application layer signaling and/or other. This may be performed to enable estimation of the service utilization ratio, although the scope of embodiments is not limited in this respect.

In another non-limiting example, a service independent CC load metric may be used. In some embodiments, an estimation of the CC load (V2X service independent) may be based on a signal power/signal quality measurement, including but not limited to an S-RSSI measurement across the CC resources. In some embodiments, a metric such as a channel busy ratio (CBR) (or similar) evaluated over the predefined time interval on predetermined resources may be used. In some embodiments, the UE 102 may estimate an amount of occupied resources based on one or more SCIs (and/or SCI decode operations) and may calculate a ratio of occupied resources to an amount of resources available at a certain time interval.

In some embodiments, the UE 102 may perform one or more operations (including but not limited to carrier selection for delivery of a given V2X service) in accordance with congestion control technique(s) and/or load balancing technique(s) across multiple CCs.

In some embodiments, method of sidelink communication using multiple component carriers (CC) may comprise one or more of, a synchronization procedure for multiple sidelink CCs; configuration of V2X service type priorities per sidelink CC; configuration of resources for synchronization signals, control information and data transmission across multiple sidelink CCs; joint sensing and resource selection across multiple sidelink CCs; sidelink control information signaling to enable cross-carrier scheduling; cross-sidelink carrier load balancing and congestion control procedures for distributed systems; and/or other.

In some embodiments, at least one group of CCs may be defined. In some embodiments, a group of CCs may be determined based on serving V2X service type. In some embodiments, the CC of a group may be synchronized with a same synchronization reference (such as a common synchronization reference). In some embodiments, CCs may be synchronized with a subframe boundary alignment in time. In some embodiments, a single CC and/or subset of CCs may be configured for sidelink synchronization signal transmission. In some embodiments, CCs may be configured with one or more priorities. In some embodiments, configured priorities may be specific for (and/or based on) V2X service type(s). In some embodiments, one CC of a group may be configured with a highest priority. In some embodiments, signals transmitted on the highest priority CC may include synchronization signals, control signals, control information and/or other.

In some embodiments, a resource pool may include resources from at least one CC. In some embodiments, a resource pool may include resources from multiple CCs. In some embodiments, joint sensing and resource selection may be performed across multiple CCs. In some embodiments, a list of candidate resources may be determined based on sensing and resource selection procedure operating across multiple CCs. In some embodiments, sidelink control signaling may comprise one or more of: same carrier scheduling, wherein an SCI may include information about transmissions on the same carrier; PSCCH cross-carrier scheduling, wherein an SCI may signal multiple data transmissions on different CCs; linked PSCCH cross carrier scheduling; and/or other.

In some embodiments, cross-sidelink carrier load balancing and congestion control procedures may be performed. In some embodiments, mapping of V2X services to sidelink CCs may be performed in accordance with one or more of a one-to-one mapping, wherein a V2X service is mapped to a single V2X CC; many-to-one mapping, wherein a single V2X service is mapped to multiple CCs or multiple V2X services are mapped to a single CC; a many-to-many mapping; and/or other.

In some embodiments, load balancing based CC selection may be performed. For instance, one or more of the following may be performed: preferential access to CC with minimum CC loading; distribution of a load across CCs; offloading of transmissions (which may be performed in accordance with a process/rule, in some cases, including but not limited to equal load, proportionally fair load and/or other). In some embodiments, priority based CC selection may be performed, such as preferential access to CC with higher priority for a given service. In some embodiments, V2X services may have different priorities to transmit on different CCs. Therefore the UE 102 may first transmit V2X service on a CC that has higher priority for given V2X service, unless this CC is overloaded/congested.

In should be noted that references herein to R14 UEs 102 and/or R15 UEs 102 are not limiting. Such references may be used for clarity, in some cases. One or more operations, techniques and/or concepts may be described herein in terms of R14 UEs 102 and/or R15 UEs 102, but it is understood that such operations, techniques and/or concepts may be applicable to embodiments that use other types of UEs 102. For instance, an operation that is performed by an R14 UE 102 in descriptions herein may be performed by a legacy UE 102 and/or other UE 102, in some embodiments. In addition, an operation that is performed by an R15 UE 102 in descriptions herein may be performed by an enhanced UE 102, a non-legacy UE 102 and/or other UE 102, in some embodiments.

In some cases, demodulation performance may be challenging for V2V communication (including but not limited to LTE-V2V communication) due to factors such as high vehicle speeds, effects of high Doppler spread or shift and/or other. For instance, these effects may be challenging in carrier frequencies allocated for ITS spectrum at around 5.9 GHz. Such effects may result in significant channel variation in time and ICI effects that may potentially prevent reliable communication using high order modulations in case of high relative/absolute speed values.

In some embodiments, one or more of the following techniques may be performed. In some case, these techniques and/or others may enable usage of 64QAM modulation for V2V communication. In some embodiments, additional DMRS resource elements (in comparison to an LTE protocol and/or legacy protocol) may be used, which may improve channel estimation performance in some cases. In some embodiments, procedures for data resource element mapping and rate-matching may be used to increase robustness of using 64QAM modulation in LTE-V2V communication. In some embodiments, communication between LTE R14 and LTE R14+UEs using 64QAM transmission format may be supported. In some embodiments, control signaling may indicate usage of 64QAM. In some embodiments, transport block sizes in an MCS/PRB allocation table may be scaled for usage with 64QAM V2V transmission formats or any other modulation including QPSK, 16QAM.

In some embodiments, techniques described herein may be used to enable usage of 64QAM modulation in an LTE-V2V communication system. In some embodiments, one or more techniques described herein may be applicable to sidelink air-interface for LTE-V2V communication. However, usage of such techniques is not limited to LTE-V2V communication and may be applied without loss of generality to other radio-interface technologies.

In some embodiments, additional DMRS REs (in comparison to the DMRS REs used in LTE systems and/or other systems) may be used. Non-limiting example resource block (RB) structures are shown in FIG. 15. The frequency index 1502 indicates an RE index on the range 0-11, and the structure 1500 includes 12 REs. The time index 1504 indicates a symbol index on the range 0-13, and the structure 1500 includes 14 symbols. The other example structures 1510-1540 have similar sizes and indexes. Embodiments are not limited to these sizes.

The example structure 1500 may be used in legacy systems, although the scope of embodiments is not limited in this respect. It should be noted that the example structure 1500 includes four symbols allocated for DMRS, and those symbols are indexed by 2, 5, 8, and 11. Embodiments are not limited to these particular indexes for the DMRS.

The example structures 1510, 1520, 1530, 1540 may be used in some embodiments. It should be noted that these structures include the four symbols of DMRS included in structure 1500 (indicated by 1506) and additional DMRS in different patterns. In some cases, the DMRS allocated for such a structure may be referred to as "DMRS for legacy" (to indicate the four symbols 1506 allocated for DMRS in structure 1500) and "additional DMRS" (to indicate the DMRS symbols/REs that are allocated in addition to the four symbols of DMRS). It should be noted that embodiments are not limited to usage of four DMRS symbols (as in the structure 1500) for the "DMRS for legacy" allocation, as other arrangements (including any number of symbols and/or REs) may be used.

It should be noted that the example structures 1510-1540 are not exhaustive, as other structures may be used. In some embodiments, a structure may have more DMRS than the structures 1510-1540. In some embodiments, a structure may have a different arrangement of the DMRS in comparison to arrangements of the structures 1510-1540. In some embodiments, a structure may include DMRS in different symbols and/or different REs in comparison to the structures 1510-1540.

In some embodiments, rate matching may be performed across multiple symbols and/or REs allocated for DMRS. In a non-limiting example, rate matching may be performed for four DMRS symbols (such as the DMRS for legacy indicated by 1506), additional DMRS REs, a last symbol of the structure, and/or a first symbol of the structure. In a non-limiting example, the first symbol may be used in the rate matching if it is used for AGC at the receiver side.

In some cases, including but not limited to cases in which a legacy LTE protocol is used, a transport block size (TBS) table may be designed assuming a fixed implementation overhead in terms of amount of REs used for channel estimation per PRB. In some embodiments, a new TBS/MCS table entries may be introduced specifically for sidelink V2V communication. In some embodiments, a TBS table may be designed with a reduced TBS size. In some embodiments, a TBS of a table (such as a TBS table for a legacy LTE protocol and/or other TBS table) may be scaled for usage. For example, the TBS table may be scaled (for instance, a reduced TBS size may be used) for usage in a protocol that supports 64QAM or any other modulation The following is a non-limiting example of such a scale operation for a TBS table for a second system (LTE R15 in this case) based on a TBS table of a first system (LTE R14): $TBS_{R15}$ =floor/ceil/round($\alpha$*$TBS_{R14}$). Here a is a scaling factor in the range 0<$\alpha$<1 and applied either to TBS or number of PRBs to determine TBS. Embodiments are not limited to LTE R15 and LTE R14. In some embodiments, the first system may be a legacy system. In some embodiments, the second system may be a non-legacy system. In some embodiments, the second system may be a system that supports 64QAM.

In the above, the scale factor $\alpha$ may be used to take into account different implementation overheads for legacy and non-legacy systems, in some cases. In a non-limiting example, $\alpha$=(14−6)/(14−2)=2/3 may be used. Other scale factors may be used, in some embodiments.

In some cases, compatibility with legacy (including but not limited to LTE R14) terminals that do not support 64QAM demodulation may be challenging. For instance, legacy (including but not limited to LTE R14) UEs 102 may not necessarily expect 64QAM transmission and may interpret high MCS indexes (which may correspond to 64QAM modulation in some MCS tables) as modulations other than 64QAM (such as 16QAM and/or other). If R14 UEs 102 and R15 UEs 102 share the same pool and there is no additional signaling defined to differentiate R14 and R15 transmissions, the R15 UEs 102 may need to perform two blind decodes (one assuming 16QAM format and one assuming 64QAM format) for MCS indexes corresponding to 64QAM modulation, given that R15 receiver does not know whether this is a 16QAM transmission from R14 UE 102 or actual 64QAM transmission from R15 UE 102. In order to remove this ambiguity, signaling (explicit or implicit) may be used. In case of explicit signaling, one or more reserved fields of SCI Format 1 may be used to indicate interpretation of MCS index to R15 UEs 102. As an alternative, the UE 102 may transmit two SCIs directed to R14 and R15+UEs 102.

In some embodiments, two or more independently encoded bit streams may be multiplexed into the 64QAM modulation. This may be performed, in some cases, in order to enable utilization of the same spectrum resource using 64QAM transmission format to both R14 and R15 UEs 102, although the scope of embodiments is not limited in this respect. In some embodiments, the R14 UEs 102 may receive bit stream that can be decoded using legacy demodulators (such as QPSK, 16QAM and/or other) possibly with limited performance loss, while R15 UEs 102 may receive all bit streams. For instance, two independent information bit streams may be encoded and/or multiplexed in accordance with: the first bit stream may be decoded by both R14 UEs 102 and R15 UEs; the second bit stream may be decoded by R15 UEs 102 but not necessarily by R14 UEs 102. In some cases, the principle described above may be viewed as a superposition of two information/modulation streams: the first stream for R14+UEs 102 (for instance, QPSK modulated) and the second stream for R15+UEs 102 (for instance, 16QAM modulated). In some embodiments, multiplexing of multiple bit streams may be used by R15 UEs 102 to communicate with R14 and R15 UEs 102 in same resources using a 64QAM format (for instance, an SC-FDMA waveform may be used).

In the non-limiting example shown in FIG. 16, a 64QAM constellation 1600 includes constellation points 1605. Each constellation point 1605 may be represented by 6 bits (as indicated by 1610). The UE 1620 may be a non-legacy UE, enhanced UE, R15 UE and/or other. The UE 1625 may be a legacy UE, R14 UE and/or other. The UE 1620 may decode/demodulate 4 bits (b2, b3, b5, b6 in this example) in accordance with a 16QAM format. The UE 1625 may decode/demodulate 2 bits (b1, b4 in this example) in accordance with a QPSK format. Embodiments are not limited to those particular groups of bits for the 16QAM and QPSK formats, as other groupings of the bits b1-b6 may be used in some embodiments.

It should be noted that vehicles are illustrated for UEs 1620, 1625 in FIG. 16 (and may be illustrated in other figures), but examples in FIG. 16 (and in other figures) are not limited to vehicles or to devices that are associated with vehicles. In a non-limiting example, a UE 102 and/or device may be integrated with a vehicle. In another non-limiting example, a UE 102 and/or device may be physically located within the vehicle (such as carried by a person in the vehicle, sitting in the seat of a vehicle and/or other). In some embodiments, a UE 102 and/or other device (which may or may not be associated with a vehicle) may transmit and/or receive some or all of the elements shown in FIG. 16.

In cases in which resource pools are shared by R14 UEs 102 and R15 UEs 102, control signaling may be used to differentiate R14 and R15 transmissions for high order modulations. This may help to avoid usage of dual blind decoding behavior for R15 UEs 102, in some cases. Non-limiting examples of such control signaling are given below.

In some embodiments, reinterpretation of existing (such as legacy, R14 and/or other) SCI Format 1 fields may be used. The SCI Format 1 may have reserved bits that can be reused to address compatibility issue(s). In this case, one SCI Format 1 can be compatible with R14 UEs another SCI Format may be used for R15 UEs 102 (for instance. SCI Format X(R15 )).

In some embodiments, dual SCI transmission may be used. In this case, SCI Format 1 may be used to provide control signaling to R14 UEs 102 (in a compatible manner) and SCI Format X may be used to send additional information for R15 UEs 102 (such as SCI Format X). In the non-limiting example 1700 shown in FIG. 17, the R15 UE 1710 may transmit SCI R15 (indicated by 1712, which may be received by the R15 UE 1730. The R15 UE 1710 may also transmit SCI R14 (indicated by 1714), which may be received by the R14 UE 1735. The R14 UE 1720 may transmit SCI R14 (indicated by 1722), which may be received by both the R15 UE 1730 and by the R14 UE 1735.

In Example 1, a User Equipment (UE) may be configured for carrier aggregation using a primary component carrier (CC) and a secondary CC. An apparatus of the UE may comprise memory. The apparatus may further comprise processing circuitry. The processing circuitry may be configured to attempt to detect a sidelink synchronization signal (SLSS) from another UE on the primary CC. The processing circuitry may be further configured to, if the SLSS from the other UE is detected: determine, based on the detected SLSS, a common time synchronization for the carrier aggregation for vehicle-to-vehicle (V2V) sidelink transmissions. The processing circuitry may be further configured to, if the SLSS from the other UE is not detected: encode an SLSS to enable determination of the common time synchronization for the primary CC and the secondary CC by the other UE. The SLSS may be encoded for transmission on the primary CC. The memory may be configured to store information that identifies the common time synchronization.

In Example 2, the subject matter of Example 1, wherein the processing circuitry may be further configured to select the primary CC or the secondary CC for a V2V sidelink transmission by the UE. The processing circuitry may be further configured to encode, for transmission, sidelink control information (SCI) that indicates scheduling information for the V2V sidelink transmission by the UE.

In Example 3, the subject matter of one or any combination of Examples 1-2, wherein the processing circuitry may be further configured to encode the SCI in accordance with same-carrier scheduling. The SCI may be transmitted on the same CC selected for the V2V sidelink transmission by the UE.

In Example 4, the subject matter of one or any combination of Examples 1-3, wherein the processing circuitry may be further configured to encode the SCI in accordance with cross-carrier scheduling, wherein the SCI is to be transmitted on a CC different from the CC selected for the V2V sidelink transmission by the UE.

In Example 5, the subject matter of one or any combination of Examples 1-4, wherein the processing circuitry may be further configured to select the primary CC or the secondary CC for the V2V sidelink transmission by the UE based on one or more of: a service type of the V2V sidelink transmission and service types supported on the primary CC and the secondary CC; a service priority of the V2V sidelink transmission and service priorities supported on the primary CC and the secondary CC; and loads of the primary CC and the secondary CC based on an overload indicator or channel busy ratio (CBR) measurements of the primary CC and the secondary CC.

In Example 6, the subject matter of one or any combination of Examples 1-5, wherein the processing circuitry may be further configured to encode, for transmission, a physical sidelink control channel (PSCCH) that carries the SCI.

In Example 7, the subject matter of one or any combination of Examples 1-6, wherein the processing circuitry may be further configured to, as part of a joint sensing and resource selection across the primary CC and the secondary CC: select resources on one CC of the primary CC and the secondary CC; and exclude the selected resources from candidate resources for resource selection on the other CC of the primary and the secondary CC.

In Example 8, the subject matter of one or any combination of Examples 1-7, wherein the SLSS is a first SLSS, and the other UE is a first UE. The processing circuitry may be further configured to, if the first SLSS from the other UE is detected: encode a second SLSS to enable determination of the common time synchronization for the primary CC and the secondary CC by at least a second UE, wherein the second SLSS is encoded for transmission on the primary CC.

In Example 9, the subject matter of one or any combination of Examples 1-8, wherein the processing circuitry may be further configured to generate signaling for transmission to a generation Node-B (gNB) in a UE-EUTRA capability field of a UE-EUTRA-Capability information element, to indicate that the UE supports Sidelink Synchronization Signal (SLSS) transmission and reception for sidelink operation.

In Example 10, the subject matter of one or any combination of Examples 1-9, wherein the processing circuitry may be further configured to attempt to detect the SLSSs from the other UEs in predetermined time-frequency resources of the primary CC allocated for SLSS transmissions.

Example 11, the subject matter of one or any combination of Examples 1-10, wherein the primary CC may be allocated for V2V sidelink transmissions of control information or data. The secondary CC may be allocated for V2V sidelink transmissions of data.

In Example 12, the subject matter of one or any combination of Examples 1-11, wherein the processing circuitry may be further configured to refrain from transmission of SLSSs on the secondary CC.

In Example 13, the subject matter of one or any combination of Examples 1-12, wherein the primary CC and the secondary CC may be configurable for one or more of; different service types mapped per CC, and different priorities assigned per CC for the different service types In Example 14, the subject matter of one or any combination of Examples 1-13, wherein one of the primary CC and the secondary CC may be configured for V2V sidelink transmission of physical sidelink shared channels (PSSCHs) in accordance with a legacy transmission time interval (TTI). Another of the primary CC and the secondary CC may be configured for V2V sidelink transmission of PSSCHs in accordance with a short TTI that is shorter than the legacy TTI.

In Example 15, the subject matter of one or any combination of Examples 1-14, wherein the processing circuitry may be further configured to encode the SLSS for transmission in accordance with a reference timing based on synchronization source priorities. The processing circuitry may be further configured to apply the reference timing for sidelink transmission and reception across aggregated CCs.

In Example 16, the subject matter of one or any combination of Examples 1-15, wherein the apparatus may further include a transceiver to transmit the SLSS.

In Example 17, the subject matter of one or any combination of Examples 1-16, wherein the processing circuitry may include a baseband processor to encode the SLSS.

In Example 18, a computer-readable storage medium may store instructions for execution by one or more processors to perform operations for communication by a User Equipment (UE). The operations may configure the one or more processors to detect a sidelink synchronization signal (SLSS) from another UE on a primary component carrier (CC) of a carrier aggregation. The primary CC may be allocated for V2V sidelink transmissions of control information or data. The carrier aggregation may include one or more secondary CCs allocated for V2V sidelink transmissions of data. The operations may further configure the one or more processors to determine, based on the detected SLSS, a common time synchronization for the primary CC and the secondary CCs for vehicle-to-vehicle (V2V) sidelink transmissions in accordance with the carrier aggregation. The operations may further configure the one or more processors to select, from the primary CC and the secondary CCs, a CC for aV2V sidelink transmission by the UE The operations may further configure the one or more processors to encode, based on a block of data bits, a physical sidelink shared channel (PSSCH) for the V2V sidelink transmission by the UE on the selected CC.

In Example 19, the subject matter of Example 18, wherein the primary CC and the one or more secondary CCs may be configurable for one or more of: one-to-one mappings between service types and the CCs, one-to-many mappings between service types and the CCs, and many-to-many mappings between service types and the CCs.

In Example 20, the subject matter of one or any combination of Examples 18-19, wherein the operations may further configure the one or more processors to encode, for transmission, a sidelink control information (SCI) for the V2V sidelink transmission by the UE that indicates whether the V2V sidelink is transmitted in accordance with a legacy format or a non-legacy format.

In Example 21, the subject matter of one or any combination of Examples 18-20, wherein multiple resource pools of time resources and frequency resources may be allocated for V2V sidelink transmissions. A first portion of the resource pools may be allocated for V2V sidelink transmissions in accordance with a legacy format. A second portion of the resource pools may be allocated for V2V sidelink transmissions in accordance with a non-legacy format.

In Example 22, an apparatus of a User Equipment (UE) may comprise memory. The apparatus may further comprise processing circuitry. The processing circuitry may be configured to encode a physical sidelink shared channel (PSSCH) based on a block of data bits, the PSSCH encoded for a vehicle-to-vehicle (V2V) sidelink transmission by the UE. The processing circuitry may be further configured to encode demodulation reference signals (DM-RSs) for the V2V sidelink transmission by the UE. The processing circuitry may be further configured to map the PSSCH and the DM-RSs to one or more physical resource blocks (PRBs) that are allocated for V2V sidelink transmission in a sub-frame. If the PSSCH is encoded with a modulation order lower than 64 quadrature amplitude modulation (64-QAM), the DM-RSs may be mapped to a plurality of symbol periods of the sub-frame. If the PSSCH is encoded with a modulation order of at least 64-QAM, the DM-RSs may be further mapped to one or more additional symbol periods of the sub-frame. The memory may be configured to store the block of data bits.

In Example 23, the subject matter of Example 22, wherein the processing circuitry may be further configured to encode the PSSCH in accordance with a rate-matching in which: the plurality of symbol periods corresponding to the DM-RSs are excluded from an encode operation; and a last symbol of the subframe is excluded from the encode operation.

In Example 24, the subject matter of one or any combination of Examples 22-23, wherein the processing circuitry may be further configured to, if the PSSCH is encoded with the modulation order of at least 64-QAM: encode, for transmission in a first chronological symbol period of the sub-frame, an automatic gain control (AGC) element to enable AGC at other UEs; and exclude the first chronological symbol period from the encode operation for the rate-matching to encode the PSSCH.

In Example 25, the subject matter of one or any combination of Examples 22-24, wherein the plurality of symbol periods may include four symbol periods. The sub-frame may span one millisecond (msec) and may include 14 symbol periods. Each PRB may include 12 REs.

In Example 26, the subject matter of one or any combination of Examples 22-25, wherein the processing circuitry may be further configured to encode the PSSCH to include one or more transport blocks (TBs) in accordance with a transport block size (TBS) table for non-legacy operation. Entries of the TBS table for non-legacy operation may be based on products of a scale factor and entries of a TBS table for legacy operation. The scale factor may be between zero and one.

In Example 27, the subject matter of one or any combination of Examples 22-26, wherein the scale factor may be based at least partly on a ratio between: a non-legacy overhead based on a first number of symbols of overhead per sub-frame as part of the non-legacy operation, and a legacy overhead based on a second number of symbols of overhead per sub-frame as part of the legacy operation.

In Example 28, the subject matter of one or any combination of Examples 22-27, wherein the scale factor may be based at least partly on a ratio between: a difference between a number of symbols per sub-frame and a first number of symbols of overhead per sub-frame as part of the non-legacy operation, and a difference between a number of symbols per sub-frame and a second number of symbols of overhead per sub-frame as part of the legacy operation.

In Example 29, the subject matter of one or any combination of Examples 22-28, wherein the number of symbols per sub-frame may be 14, the first number of symbols of overhead per sub-frame may be 6, the second number of symbols of overhead per sub-frame may be 2, and the scale factor may be 2/3.

In Example 30, an apparatus of a User Equipment (UE) may comprise means for detecting a sidelink synchronization signal (SLSS) from another UE on a primary component carrier (CC) of a carrier aggregation. The primary CC may be allocated for V2V sidelink transmissions of control information or data. The carrier aggregation may include one or more secondary CCs allocated for V2V sidelink transmissions of data. The apparatus may further comprise means for determining, based on the detected SLSS, a common time synchronization for the primary CC and the secondary CCs for vehicle-to-vehicle (V2V) sidelink transmissions in accordance with the carrier aggregation. The apparatus may further comprise means for selecting, from the primary CC and the secondary CCs, a CC for aV2V sidelink transmission by the UE. The apparatus may further comprise means for encoding, based on a block of data bits, a physical sidelink shared channel (PSSCH) for the V2V sidelink transmission by the UE on the selected CC.

In Example 31, the subject matter of Example 30, wherein the primary CC and the one or more secondary CCs may be configurable for one or more of, one-to-one mappings between service types and the CCs, one-to-many mappings between service types and the CCs, and many-to-many mappings between service types and the CCs.

In Example 32, the subject matter of one or any combination of Examples 30-31, wherein the apparatus may further comprise means for encoding, for transmission, a sidelink control information (SCI) for the V2V sidelink transmission by the UE that indicates whether the V2V sidelink is transmitted in accordance with a legacy format or a non-legacy format.

In Example 33, the subject matter of one or any combination of Examples 30-32, wherein multiple resource pools of time resources and frequency resources are allocated for V2V sidelink transmissions. A first portion of the resource pools may be allocated for V2V sidelink transmissions in accordance with a legacy format. A second portion of the resource pools may be allocated for V2V sidelink transmissions in accordance with a non-legacy format.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus, comprising:
   memory; and
   processing circuitry in communication with the memory and configured to:
   receive signaling indicating sidelink transmission, wherein the signaling indicates using 64 quadrature amplitude modulation (64-QAM);
   in response to the signaling, determine a transport block size (TBS) using a 64-QAM specific table, wherein the determined TBS is a new TBS value with respect to legacy values determined using a modulation coding scheme index and a number of physical resource blocks;
   encode a sidelink shared channel transmission using the determined transport block size;
   encode demodulation reference signals (DM-RSs) for the sidelink shared channel transmission; and
   map the sidelink shared channel transmission and the DM-RSs to one or more physical resource blocks (PRBs) that are allocated for a physical sidelink shared channel (PSSCH).

2. The apparatus of claim 1,
   wherein the processing circuitry is further configured to:
   perform rate matching for a last symbol of the sidelink shared channel transmission.

3. The apparatus of claim 1,
   wherein the determined TBS is a scaled TBS in a modulation coding scheme and physical resource block allocation table.

4. The apparatus of claim 3,
   wherein the scaled TBS is scaled using a scale factor with a value between 0 and 1.

5. The apparatus of claim 1,
   wherein the processing circuitry is further configured to:
   perform rate matching for a first symbol of the sidelink shared channel transmission.

6. The apparatus of claim 1,
   wherein the DM-RS for the sidelink shared channel transmission uses a DM-RS pattern with additional DM-RS resource elements.

7. The apparatus of claim 6,
   wherein the additional DM-RS resource elements support 64-QAM.

8. A non-transitory computer-readable storage medium storing program instructions executable by one or more processors to cause a user equipment (UE) to:
   receive signaling indicating sidelink transmission by the UE, wherein the signaling indicates using 64 quadrature amplitude modulation (64-QAM);
   in response to the signaling, determine a transport block size (TBS) using a 64-QAM specific table, wherein the determined TBS is a new TBS value with respect to legacy values determined using a modulation coding scheme index and a number of physical resource blocks;
   encode a sidelink shared channel transmission using the determined transport block size;
   encode demodulation reference signals (DM-RSs) for the sidelink shared channel transmission by the UE; and
   map the sidelink shared channel transmission and the DM-RSs to one or more physical resource blocks (PRBs) that are allocated for a physical sidelink shared channel (PSSCH).

9. The non-transitory computer-readable storage medium of claim 8,
   wherein the program instructions are further executable by the one or more processors to cause the UE to:
   perform rate matching for a last symbol of the sidelink shared channel transmission.

10. The non-transitory computer-readable storage medium of claim 8,
    wherein the determined TBS is a scaled TBS in a modulation coding scheme and physical resource block allocation table.

11. The non-transitory computer-readable storage medium of claim 10,
    wherein the scaled TBS is scaled using a scale factor with a value between 0 and 1.

12. The non-transitory computer-readable storage medium of claim 8,
    wherein the program instructions are further executable by the one or more processors to cause the UE to:
    perform rate matching for a first symbol of the sidelink shared channel transmission.

13. The non-transitory computer-readable storage medium of claim 8, wherein the DM-RS for the sidelink shared channel transmission uses a DM-RS pattern with additional DM-RS resource elements.

14. The non-transitory computer-readable storage medium of claim 13,
wherein the additional DM-RS resource elements support 64-QAM.

15. A method performed by a user equipment device (UE), comprising:
receiving signaling indicating sidelink transmission by the UE, wherein the signaling indicates using 64 quadrature amplitude modulation (64-QAM);
in response to the signaling, determining a transport block size (TBS) using a 64-QAM specific table, wherein the determined TBS is a new TBS value with respect to legacy values determined using a modulation coding scheme index and a number of physical resource blocks;
encoding a sidelink shared channel transmission using the determined transport block size;
encoding demodulation reference signals (DM-RSs) for the sidelink shared channel transmission by the UE; and
mapping the sidelink shared channel transmission and the DM-RSs to one or more physical resource blocks (PRBs) that are allocated for a physical sidelink shared channel (PSSCH).

16. The method of claim 15, further comprising:
performing rate matching for a last symbol of the sidelink shared channel transmission.

17. The method of claim 15,
wherein the determined TBS is a scaled TBS in a modulation coding scheme and physical resource block allocation table.

18. The method of claim 15, further comprising:
performing rate matching for a first symbol of the sidelink shared channel transmission.

19. The method of claim 15,
wherein the DM-RS for the sidelink shared channel transmission uses a DM-RS pattern with additional DM-RS resource elements to support 64-QAM.

20. The method of claim 19,
wherein the additional DM-RS resource elements support 64-QAM.

* * * * *